United States Patent
Vasoya

(10) Patent No.: US 8,203,080 B2
(45) Date of Patent: Jun. 19, 2012

(54) BUILD-UP PRINTED WIRING BOARD SUBSTRATE HAVING A CORE LAYER THAT IS PART OF A CIRCUIT

(75) Inventor: Kalu K. Vasoya, Placentia, CA (US)

(73) Assignee: Stablcor Technology, Inc., Huntington Beach, CA (US)

( * ) Notice: Subject to any disclaimer, the term of this patent is extended or adjusted under 35 U.S.C. 154(b) by 0 days.

(21) Appl. No.: 11/879,256

(22) Filed: Jul. 16, 2007

(65) Prior Publication Data

US 2008/0011507 A1 Jan. 17, 2008

Related U.S. Application Data

(60) Provisional application No. 60/831,108, filed on Jul. 14, 2006.

(51) Int. Cl.
*H05K 1/03* (2006.01)
(52) U.S. Cl. .......................... 174/255; 174/260; 174/262
(58) Field of Classification Search .................. 174/255, 174/260, 262; 361/792–795
See application file for complete search history.

(56) References Cited

U.S. PATENT DOCUMENTS

| | | | |
|---|---|---|---|
| 4,299,873 A | 11/1981 | Ogihara et al. |
| 4,318,954 A | 3/1982 | Jensen |
| 4,591,659 A | 5/1986 | Leibowitz |
| 4,604,319 A | 8/1986 | Evans et al. |
| 4,664,768 A | 5/1987 | Scala et al. |
| 4,689,110 A | 8/1987 | Leibowitz |
| 4,747,897 A | 5/1988 | Johnson |
| 4,769,270 A | 9/1988 | Nagamatsu et al. |
| 4,792,646 A | 12/1988 | Enomoto |
| 4,812,792 A | 3/1989 | Leibowitz |
| 4,878,152 A | 10/1989 | Sauzade et al. |
| 4,888,247 A | 12/1989 | Zweben et al. |
| 5,004,639 A | 4/1991 | Desai |
| 5,250,363 A * | 10/1993 | Chen .......................... 428/607 |

(Continued)

FOREIGN PATENT DOCUMENTS

EP 00313961 5/1989

(Continued)

OTHER PUBLICATIONS

International Search Report for International Application PCT/US2007/016210, Report completed Jun. 3, 2008, mailed Oct. 15, 2008, 4 pgs.

(Continued)

*Primary Examiner* — Ishwarbhai Patel
(74) *Attorney, Agent, or Firm* — Kauth, Pomeroy, Peck & Bailey LLP

(57) ABSTRACT

Integrated circuits and processes for manufacturing integrated circuits are described that use printed wiring board substrates having a core layer that is part of the circuit of the printed wiring board. In a number of embodiments, the core layer is constructed from a carbon composite. In several embodiments, techniques are described for increasing the integrity of core layers in designs calling for high density clearance hole drilling. One embodiment of the invention includes a core layer that includes electrically conductive material and at least one build-up wiring portion formed on an outer surface of the core layer. In addition, the build-up portion comprises at least one micro wiring layer including a circuit that is electrically connected to the electrically conductive material in the core layer via a plated through hole.teh

18 Claims, 19 Drawing Sheets

U.S. PATENT DOCUMENTS

| | | | |
|---|---|---|---|
| 5,326,636 | A | 7/1994 | Durand et al. |
| 5,354,599 | A | 10/1994 | McClanahan et al. |
| 5,382,505 | A | 1/1995 | Schmidt et al. |
| 5,436,062 | A | 7/1995 | Schmidt et al. |
| 5,509,200 | A * | 4/1996 | Frankeny et al. ............... 29/852 |
| 5,527,838 | A | 6/1996 | Afzali-Ardakani et al. |
| 5,646,373 | A | 7/1997 | Collins et al. |
| 5,746,929 | A | 5/1998 | Schmidt et al. |
| 5,861,666 | A | 1/1999 | Bellaar |
| 6,013,588 | A | 1/2000 | Ozaki |
| 6,016,598 | A | 1/2000 | Middelman et al. |
| 6,054,337 | A | 4/2000 | Solberg |
| 6,147,401 | A | 11/2000 | Solberg |
| 6,207,904 | B1 | 3/2001 | Kramer et al. |
| 6,214,640 | B1 | 4/2001 | Fosberry et al. |
| 6,222,740 | B1 | 4/2001 | Bovensiepen et al. |
| 6,225,688 | B1 | 5/2001 | Kim et al. |
| 6,232,152 | B1 | 5/2001 | DiStefano et al. |
| 6,313,528 | B1 | 11/2001 | Solberg |
| 6,329,603 | B1 | 12/2001 | Japp et al. |
| 6,340,796 | B1 | 1/2002 | Smith et al. |
| 6,373,000 | B2 | 4/2002 | Nakamura et al. |
| 6,400,576 | B1 | 6/2002 | Davidson |
| 6,486,394 | B1 | 11/2002 | Schmidt et al. |
| 6,541,865 | B2 | 4/2003 | Hawker et al. |
| 6,613,313 | B2 | 9/2003 | Kimura |
| 6,711,812 | B1 * | 3/2004 | Lu et al. ............... 29/852 |
| 6,794,748 | B1 | 9/2004 | Chiu |
| 6,869,665 | B2 | 3/2005 | Tani et al. |
| 6,920,624 | B2 | 7/2005 | Garrepally et al. |
| 6,938,227 | B2 | 8/2005 | Murphy et al. |
| 7,002,080 | B2 | 2/2006 | Tani et al. |
| 7,038,142 | B2 * | 5/2006 | Abe ............... 174/255 |
| 7,378,602 | B2 * | 5/2008 | Ikeda ............... 174/262 |
| 7,388,157 | B2 * | 6/2008 | Abe et al. ............... 174/256 |
| 2004/0118602 | A1 | 6/2004 | Lee et al. |
| 2004/0163248 | A1 | 8/2004 | Lu et al. |

FOREIGN PATENT DOCUMENTS

| | | |
|---|---|---|
| EP | 1821586 A1 | 8/2007 |
| GB | 2248725 | 4/1992 |
| JP | 2004-355203 | 12/2004 |
| WO | WO9502505 | 1/1995 |
| WO | WO9717199 | 5/1997 |

OTHER PUBLICATIONS

Written Opinion for International Application PCT/US2007/016210, Opinion completed Jun. 3, 2008, mailed Oct. 15, 2008, 5 pgs.

International Search Report for International Application No. PCT/US2005/017150, International Filing Date May 16, 2005, Search completed Jan. 10, 2007, mailed Mar. 5, 2007, 4 pgs.

Written Opinion for International Application No. PCT/US2005/017150, International Filing Date May 16, 2005, Search completed Jan. 10, 2007, mailed Mar. 5, 2007, 6 pgs.

International Search Report for International Application No. PCT/US2004/028246 filed Aug. 30, 2004, report completed Feb. 8, 2006, mailed Dec. 15, 2006, 3 pgs.

Written Opinion for International Application No. PCT/US2004/028246 filed Aug. 30, 2004, report completed Aug. 23, 2006, mailed Dec. 15, 2006, 3 pgs.

International Search Report dated Jan. 11, 2006 mailed Jan. 19, 2006 for Application No. PCT/US2005/030709 filed Aug. 29, 2005, 2 pgs.

Written Opinion dated Jan. 11, 2006 mailed Jan. 19, 2006 for Application No. PCT/US2005/030709 filed Aug. 29, 2005, 3 pgs.

Meier et al., "Lasering Structuring of Fine Lines", posted Sep. 1, 2000, 7 pgs.

"Thermal Management of Electronics", The 5th International Business and Technology Summit, Aug. 17-18, 2005, Natick, MA, Show brochure and documents, ~465 pgs. (2-sided).

Decision on Appeal of U.S. Appl. No. 10/921,649; mailed Jul. 24, 2009, 12 pgs.

* cited by examiner

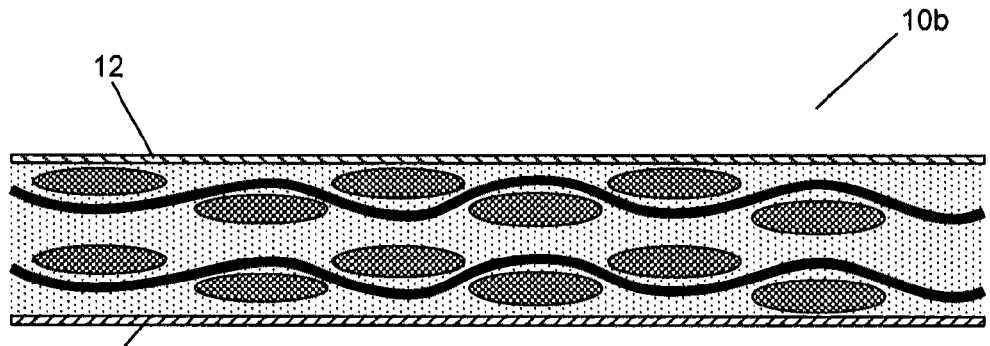
FIG. 4A
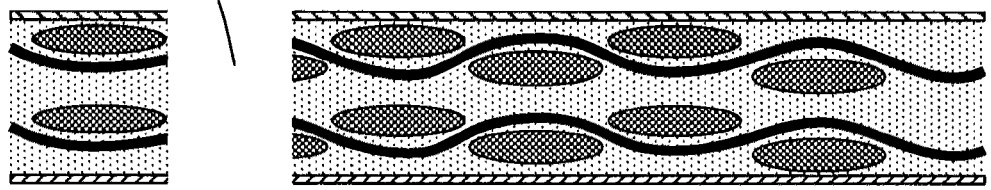
FIG. 4B
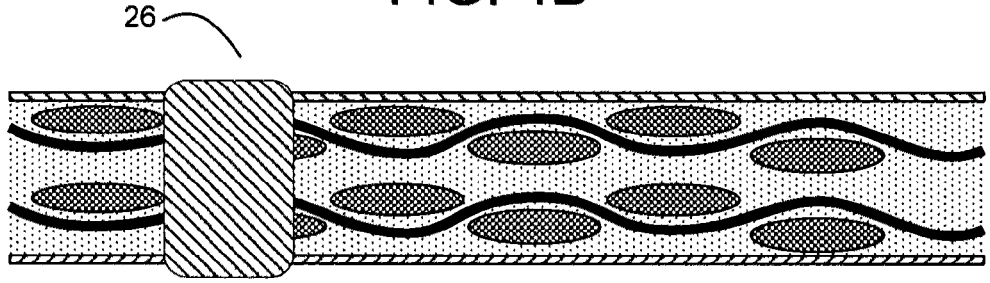
FIG. 4C'
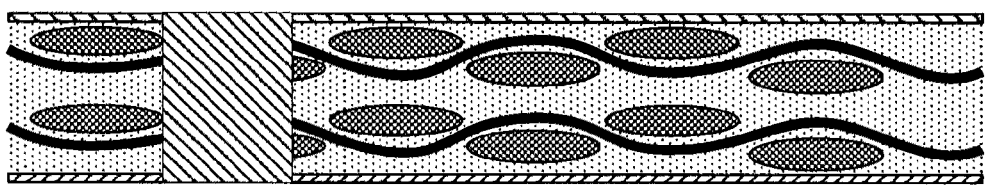
FIG. 4C"

BUILD-UP PRINTED WIRING BOARD SUBSTRATE HAVING A CORE LAYER THAT IS PART OF A CIRCUIT

CROSS REFERENCE TO RELATED APPLICATION

The application claims the benefit of U.S. Provisional Patent Application No. 60/831,108, filed Jul. 14, 2006, the contents of which are expressly incorporated herein by reference in its entirety.

BACKGROUND OF THE INVENTION

1. Field of the Invention

The present invention relates generally to the multilayer printed wiring boards and more specifically relates to multilayer build-up substrates that include at least one light weight constraining core that is part of the electrical circuit of the printed wiring board.

2. Description of the Related Prior Art

Semiconductor device fabrication typically involves the creation of a semiconductor die using chemical processes followed by the packaging of the die. Mounting the die in the packaging includes connecting the die pad pins to the pins on the packaging. In many applications, the interconnection between the die pad pins and the pins on the packaging is achieved by directly mounting the semiconductor die to a printed wiring board (PWB) substrate. The semiconductor die and the substrate are then encapsulated within packaging and the substrate provides the connections between the die pad pins and the packaging pins.

Various direct mounting techniques are known including flip-chip mounting (FC), direct chip attach (DCA), direct die attach (DDA), and flip chip on board (FCOB). These techniques usually involve the fixing of a semiconductor die to a build-up PWB substrate. Build-up PWB substrates typically include a central constraining layer or "core" to which comparatively thin dielectric layers are attached. The thin dielectric layers include fine circuit features and narrow diameter plated vias. A core can be constructed using a glass fiber based dielectric material possessing physical characteristics similar to those of glass fiber based dielectric materials used in the construction of the type of PWB on which an integrated circuit (i.e., a packaged semiconductor device) would be surface mounted. To distinguish between PWBs on which ICs are mounted and PWB substrates, the former are referred to as conventional PWBs. The thin dielectric layers in build-up PWB substrates are constructed from a class of materials that are typically not used in the construction of conventional PWBs. Specialized processing techniques are used to bond the core and the thin dielectric layers and to form the fine circuit traces and narrow diameter plated vias.

A problem that can be encountered when using direct die mount with a PWB substrate is that thermal cycling can cause the device to fail. A significant co-efficient of thermal expansion (CTE) difference often exists between a semiconductor die material and the PWB substrate and, consequently, thermal cycling can break connections between the die and the PWB substrate. Semiconductor die materials typically have CTEs of between 2.5 ppm/° C. to 4.0 ppm/° C. A substrate including a fiberglass epoxy based constraining layer typically has a CTE of 14 ppm/° C. to 20 ppm/° C. parallel to the surface plane. The CTE mismatch between the semiconductor die and substrate material can stress connection points between the semiconductor die and the PWB substrate during thermal cycling. The stresses placed upon the connection points can be related to the distance between a connection point and a neutral point (DNP). A neutral point is a location that experiences zero displacement during thermal cycling. The larger the semiconductor, the greater the maximum DNP. Therefore, increasing semiconductor die size can cause increased stress on connection points between the semiconductor die and the substrate and ultimately reduce electrical connection reliability.

An adhesive underfill can be used to offset or reduce some of the induced stresses caused by CTE mismatch between a semiconductor die and a PWB substrate. However, when a larger semiconductor chip is mounted on a substrate, the stress reduction by underfill can be insufficient to ensure reliable contacts between the die pins and the PWB substrate.

In many applications build-up PWB substrates that include cores, which reduce the CTE of the PWB substrate, are used to construct ICs. U.S. Pat. No. 6,711,812 to Lu et al. and U.S. Patent Publication 2004/0163248 to Lu et al. describe the use of a thick copper core in a PWB substrate, which reduces the CTE of the PWB substrate. Other metal alloys that are used to reduce the CTE of PWB substrates include nickel-Iron alloys, copper-Invar-Copper (CIC), and Copper-Molybdenum-Copper (CMC). Using metals in the construction of a PWB substrate core has a tendency to increase the weight of the PWB substrate compared to the use of a fiberglass based core material. In addition, thick metal core layers are very difficult to process.

U.S. Pat. No. 6,869,665 to Tani et al., U.S. Pat. No. 7,002,080 Tani et al., and Japanese Patent publication 60-140898 to Tani et al. (the Tani. et al. references) disclose PWB substrates formed with micro-wiring structure, which are manufactured using a build-up method on a core constructed using a resin composite enclosing several pieces of carbon fiber cloth. The Tani et al. references also disclose that plated through holes extending through the core are electrically isolated from the carbon fiber cloth by cylindrical insulating resin portions formed on the wall surfaces of the through holes.

Use of a PWB substrate including a core constructed using a carbon fiber material in a manner similar to that disclosed in the Tani et al. references can provide a PWB substrate with a lower CTE than an equivalent PWB substrate with a core constructed using a glass fiber based material and, which is significantly lighter than an equivalent PWB substrate with a core constructed using a metal or metal alloy material. A potential exists, however, for PWB substrates with cores constructed using carbon fiber materials in the manner outlined in the Tani et al. references to fail when there is a high density of plated through holes extending through the core. Creating the cylindrical insulating resin portions described in the Tani et al. references involves removal of an amount of carbon fiber material from the core. As the density of through holes extending through the core increases, the amount of carbon fiber material removed also increases. Beyond a certain point, the amount of material removed can compromise the physical properties of the core.

The disclosure of U.S. Pat. No. 6,869,665 to Tani et al., U.S. Pat. No. 7,002,080 Tani et al., Japanese Patent publication 60-140898 to Tani et al., and U.S. Pat. No. 6,711,812 to Lu et al. and U.S. Patent Publication 2004/0163248 to Lu et al. is incorporated herein by reference in its entirety.

SUMMARY OF THE INVENTION

PWB substrates and methods of construction Printed Wiring Board (PWB) substrates in accordance with embodiments of the invention are disclosed. In many embodiments, the PWB substrates include a core layer that is part of the circuit of the PWB substrate. Integrated Circuits (ICs) and methods of constructing ICs including semiconductor dies mounted on PWB substrates that use a core layer that is part of the circuit of the PWB substrate in accordance with embodiments of the invention are also disclosed.

In many embodiments, PWB substrates are formed using a build-up micro-wiring structure to create circuits within the PWB substrates that include the core layer. In several embodiments, the core layer forms a power plane, a ground plane or a split power and ground plane. In a number of embodiments, plated through holes are used to establishes electrical connections between the core layer and circuits located on other layers of the PWB substrate. In many embodiments, use of the core as part of the circuit reduces the number of layers required to construct a PWB substrate when compared to an equivalent PWB substrate that includes a core, which is not part of the circuit of the PWB substrate. The elimination of a layer can reduce the thickness of the PWB substrate. In a number of embodiments, use of the core as a ground, power or split plane reduces the number of resin filled clearance holes that are required when compared to a similar PWB substrate design that includes a core layer that does not form part of the PWB substrate circuit.

In several embodiments, the core layer includes carbon material. In many embodiments, the carbon material is at least one layer of resin impregnated carbon fibers clad on at least one side with a layer of metal. In a number of embodiments, the layer of metal directly contacts the carbon fibers. In many embodiments, the direct contact is achieved due to the surface of the layer of metal including protrusions (dendrites) that extend outward and contact the carbon fibers. In other embodiments, at least one of a variety of carbon materials is used in the construction of the core.

One embodiment of the invention includes a core layer that includes electrically conductive material and at least one build-up wiring portion formed on an outer surface of the core layer. In addition, the build-up portion comprises at least one micro wiring layer including a circuit that is electrically connected to the electrically conductive material in the core layer via a plated through hole.

In a further embodiment of the invention the coefficient of thermal expansion of the core layer is lower than the coefficient of thermal expansion of the at least one build-up portion.

In another embodiment of the invention, the core layer is configured to act as a ground plane.

In a still further embodiment of the invention, the core layer is configured to act as a power plane.

In still another embodiment of the invention, the core layer is configured to act as a split power and ground plane.

In a yet further embodiment of the invention, the core layer includes a carbon material.

In yet another embodiment of the invention, the carbon material is carbon fiber.

In a further embodiment again, the core layer includes at least one ply of woven carbon fiber.

In another embodiment again, the core layer is clad on at least one side with a layer of metal that is bonded to the carbon fiber by resin.

In a further additional embodiment, the layer of metal includes an interior surface from which protrusions (dendrites) extend, a plurality of the protrusions contact carbon fibers and the layer of metal includes an exterior surface that is planar.

In another additional embodiment, the core layer comprises a first electrically conductive layer that is bonded to a second electrically conductive layer by a dielectric layer that electrically isolates the first layer from the second layer.

In a yet still further embodiment, a first build-up wiring portion is formed on an upper surface of the core layer, a second build-up wiring portion is formed on a lower surface of the core layer, a plated through hole connects a circuit on a micro wiring layer in the first build up wiring portion with a circuit on a micro wiring layer in the second build up wiring portion and the plated through hole is electrically isolated form the electrically conductive material in the core layer by a resin filled clearance hole.

In yet still another embodiment, the core layer has a coefficient of thermal expansion of between 0 ppm/° C. and 12 ppm/° C. in the surface spreading direction.

In yet a further embodiment again, the core layer has a coefficient of thermal expansion of between 0 ppm/° C. and 9 ppm/° C. in the surface spreading direction.

In yet another embodiment again, the core layer has a thermal conductivity of between 2 W/m.K and 500 W/m.K in the surface spreading direction.

In a yet further additional embodiment, the core layer has a thermal conductivity of between 50 W/m.K and 1000 W/m.K in the surface spreading direction.

In yet another additional embodiment, the core layer has a tensile strength of between 5 msi and 35 msi in the surface spreading direction.

In a still further embodiment again, the core layer has a tensile strength of between 10 msi and 40 msi in the surface spreading direction.

In still another embodiment again, the core layer has a dielectric constant that is greater than 6.0 at 1 MHz.

In many embodiments, the core layer has a thickness that is at least 30% of the thickness of the printed wiring board substrate. In several embodiments, the core layer is between 30% and 80% of the finished printed wiring board substrate thickness. In a number of embodiments, the core layer is between 40% and 60% of the finished printed wiring board substrate thickness. In many embodiments, the core layer has a thickness of between 0.002" and 0.100". In several embodiments, the core layer has a thickness of between 0.010" and 0.050".

Another further embodiment includes a semiconductor die mounted to a printed wiring board substrate, where the printed wiring board substrate includes a core layer that forms part of a circuit that electrically connects the core layer and the semiconductor die.

An embodiment of the method of the invention includes drilling clearance holes in a layer of core material, filling the clearance holes with resin, curing the resin, planarizing the surface of the layer of core material, applying bonding promoter surface treatment to a layer of metal that is bonded to the layer of core material, applying layers of dielectric material to both sides of the layer of core material, curing the layers of dielectric material and layer of core material, drilling through holes in the cured layers, forming a wiring pattern and plating the through holes, building-up additional layers of dielectric material and micro wiring layers and applying an overcoat layer.

BRIEF DESCRIPTION OF THE DRAWINGS

FIGS. 4A-4M are schematic cross-sectional views of various build-up PWB substrate subassemblies in accordance with embodiments of the invention that are constructed as part of the manufacturing process illustrated in FIG. 3.

DETAILED DESCRIPTION OF THE INVENTION

Turning now to the drawings, build-up Printed Wiring Board (PWB) substrates that include at least one core layer as an electrical layer in accordance with embodiments of the invention are shown. In addition, Integrated Circuits (ICs) that include semiconductor dies attached to PWB substrates that include at least one core layer as an electrical layer in accordance with embodiments of the invention are shown. In a number of embodiments, the core layer is constructed from a material that includes carbon. In many embodiments, the carbon material includes resin impregnated carbon fibers clad with layers of metal. In several embodiments, the layers of metal include a smooth exterior surface and a rough interior surface with protrusions that contact some of the carbon fibers. In a number of embodiments, the design of the PWB substrate is modified to improve the structural properties of the core layer compared to an unmodified PWB substrate design.

PWB Substrates

Figure 1:
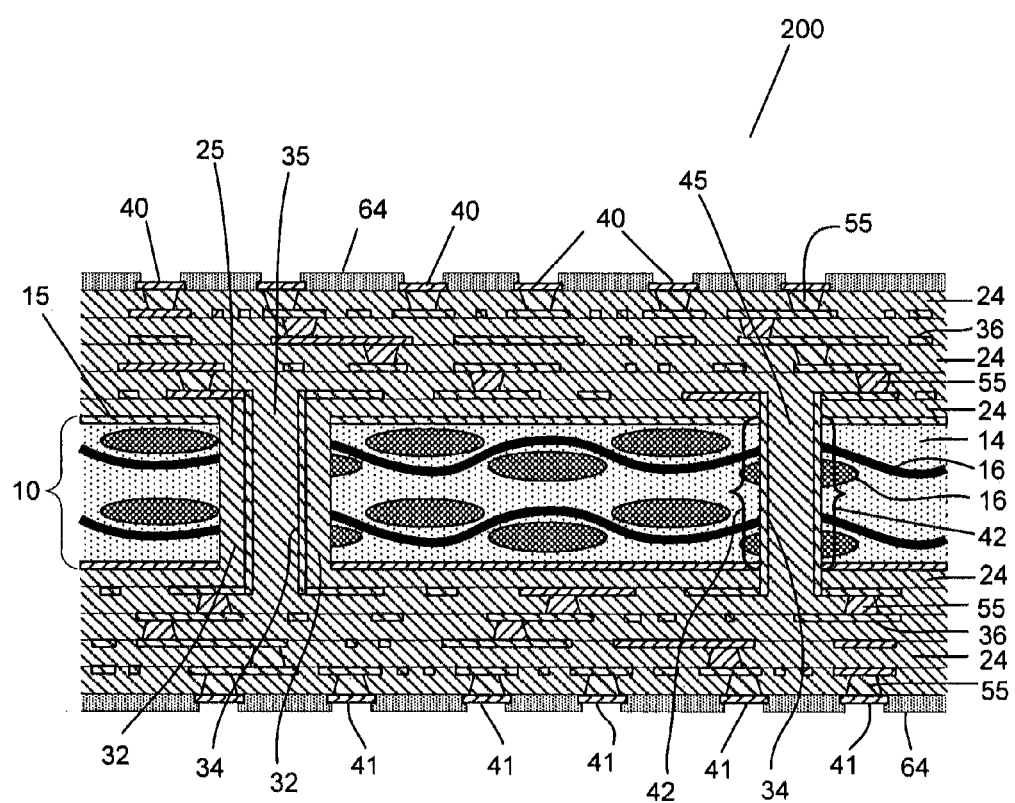
FIG. 1 is a schematic cross sectional view of a build-up multilayer PWB substrate that includes a core layer that is part of the PWB substrate circuit in accordance with an embodiment of the invention.

A build-up PWB substrate in accordance with an embodiment of the invention is shown in FIG. 1. The build-up PWB substrate 200 includes a core layer 10 on the upper and lower surfaces of which build-up wiring portions are formed. The build-up wiring portions include a plurality of micro wiring layers 36 that are separated by dielectric layers 24. The dielectric layers 24 and micro wiring layers 36 are stacked alternatively in the thickness direction of the substrate. In the illustrated embodiment, the core layer 10 forms part of the circuit of the PWB substrate 200.

A variety of techniques can be used to establish electrical connections between the various functional layers on the substrate PWB 200 (i.e. the core layer 10 and the micro wiring layers 36). Vias 55 form electrical connections between the circuits on the various micro wiring layers 36 in each of the upper and lower build-up wiring portions. Plated through holes 35, 45 are used to create connections between the micro wiring layers 36 in the upper build-up wiring portion and the micro wiring layers 36 in the lower build-up wiring portions. Plated through holes 45 are also used to create connections between the micro wiring layers 36 and the core layer 10. Whether a plated through hole 35, 45 creates an electrical connection with the core layer 10 depends upon whether the plating of the through hole is electrically isolated from the electrically conductive materials in the core layer 10. In the illustrated embodiment, resin filled clearance holes 25 that extend from the upper surface of the core layer 10 to the lower surface of the core layer 10 are used to electrically isolate plated through holes 35 from the core layer 10. The resin 32 surrounding the plating 34 of the plated through hole 35 effectively prevents conduction of electricity between the plated through hole 35 and the core layer 10 during normal operation. In the absence of a resin filled clearance hole, electricity can conduct between the core layer 10 and the plating 34 of a plated through hole 45 creating an electrical connection 42 between the core layer 10 and the plated through hole 45. A plated through hole 45 that creates an electrical connection between a circuit on a micro wiring layer 36 in the upper build-up wiring portion and the core layer 10 typically will also create a connection with circuit on a micro wiring layer 36 in the lower build-up wiring portion. However, a plated through hole need not establish connections with the core layer 10 and micro wiring layers 36 in both build-up wiring portions.

When the core layer is used as a functional layer in accordance with embodiments of the invention, the number of resin filled clearance holes drilled through the core layer is reduced compared to the number of resin filled clearance holes required in the core layer of an equivalent PWB substrate that does not use the core layer as part of the circuit of the PWB substrate. The reduction is due to the fact that a proportion (that can be as high as 20%) of the plated through holes that intersect the core layer do not require electrical isolation from the core layer, when the core layer is a functional layer, whereas all of the plated through holes require electrical isolation from the core layer, when the core layer is not a functional layer. The in-plane CTE of a PWB substrate in accordance with an embodiment of the invention is directly affected by the amount of material removed from the core layer 10 during the creation of resin filled clearance holes. Increasing the thickness of the core layer 10 can compensate for increases in CTE related to the removal of material from the core layer during the creation of resin filled clearance holes. Using the core layer as a functional layer can reduce the amount of material that is required to be removed from the core layer, which enables the construction of PWB substrates in accordance with embodiments of the invention that are thinner than equivalent PWB substrates that do not utilize the core layer as a functional layer.

The outermost circuit patterns on the upper surface of the PWB substrate 200 shown in FIG. 1 can include bump pads 40 that form a first-level interconnect to which a semiconductor die (not shown) can be direct mounted. The outermost circuit patterns on the lower surface of the PWB substrate 200 can include ball pads 41 that form a second-level interconnect that can be used to interconnect the circuits of the PWB substrate 200 to second-level packaging such as a conventional PWB. The outermost circuit patterns of the PWB substrate can be covered with an overcoat layer 64 that leaves the bump pads 40 and the ball pads 41 exposed.

The core layer 10 of the PWB substrate 200 can perform a number of electrical functions within the PWB substrate in accordance with embodiments of the invention. In several embodiments, the core layer 10 acts as a ground plane. In many embodiments, the core layer 10 acts as a power plane. In a number of embodiments the core layer 10 acts as a split ground and power plane. U.S. Pat. No. 6,869,664 to Vasoya et al., U.S. patent application Ser. No. 11/131,130 to Vasoya and U.S. patent application Ser. No. 11/376,806 to Vasoya describe the use of constraining cores as power, ground and/or split power/ground planes in printed wiring boards. The disclosure of U.S. Pat. No. 6,869,664 to Vasoya et al., U.S. patent application Ser. No. 11/131,130 to Vasoya and U.S. patent application Ser. No. 11/376,806 to Vasoya is hereby incorporated by reference in its entirety.

Figure 5:
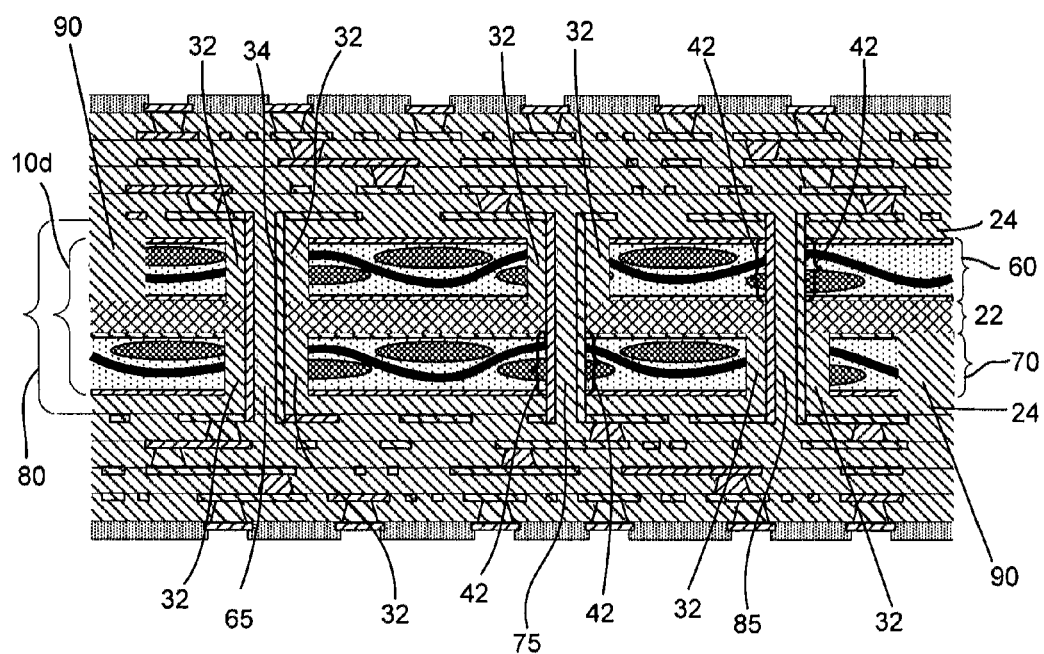
FIG. 5 is a schematic cross section of a build-up PWB substrate constructed in accordance with another embodiment of the invention that includes a core layer constructed from a material similar to the material illustrated in FIG. 2D.

Although the embodiment shown in FIG. 1 includes a single core layer, embodiments of the invention can include multiple core layers and, as is shown in FIG. 5, can include a core layers that include multiple functional layers of the PWB substrate. In another embodiment, the core layer is in a fact a multiple layer PWB on which build-up wiring portions are formed. Examples of suitable PWB structures in accordance with embodiments of the invention are described in the patents and patent applications to Vasoya et al. and Vasoya incorporated by reference above.

Materials for Constructing PWB Substrates

In many embodiments, electrically conductive material is included in the core layer 10 to enable the core layer to act as part of a circuit. In several embodiments, the core layer 10 includes carbon fiber tow 16 reinforced with resin 14 and the core layer is clad on at least one side with a metal layer 12. The metal layer can also act as a buffer layer between the low CTE core layer and the very high CTE non-reinforced dielectric material used in the build-up portions. As is discussed further below, the metal layer can include protrusions or dendrites that extend into the resin fiber matrix of the core layer. The protrusions (dendrites) create a three dimensional bond that can tolerate more in plane shear stress than a planar bond. In a number of embodiments, the layer of metal 12 increases the electrical load that can be carried by the core layer. In other embodiments, the core layer 10 can be formed using any of a variety of materials. Material that can be used in the construction of core layers 10 in accordance with embodiments of the invention are discussed further below with respect to FIGS. 2A-2E.

The materials and processes used in the construction of build-up wiring portions of build-up PWB substrates are typically specialized to the construction of build-up PWB substrates. The micro wiring layers are typically constructed from a metal or metal alloy such as copper and the dielectric layers are typically non-reinforced resin layers such as ABF film. The same materials and construction processes that are used in the construction of the build-up wiring portions of conventional build-up PWB substrates can be used to construct the micro wiring layers 36 and the dielectric layers 24 of the build-up wiring portions of PWB substrates in accordance with embodiments of the invention including the PWB substrate 200 shown in FIG. 1.

Core Layers

As indicated above, core layers that act as part of the circuit of a PWB substrate in accordance with embodiments of the invention can be constructed in a variety of ways. A number of materials that can be used in the construction of a core layer in a PWB in accordance with embodiments of the invention are illustrated in FIGS. 2A-2E. In addition, any combination of materials discussed below and/or materials that can be used to construct an electrically conductive layer or laminate within a PWB can be used to construct constraining cores taught below can be used to construct core layers cores in accordance with embodiments of the invention (including those materials described in the patents and patent applications incorporated by reference above and the materials listed below).

Figure 2A:
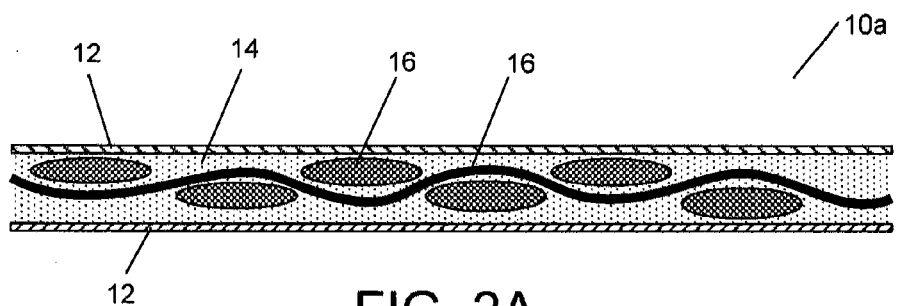
FIG. 2A is a schematic cross sectional view of an embodiment of a material including a single ply of resin impregnated carbon fiber cloth clad on both sides with layers of metal that can be used as a core layer within a PWB substrate in accordance with an embodiment of the invention.
Figure 2B:
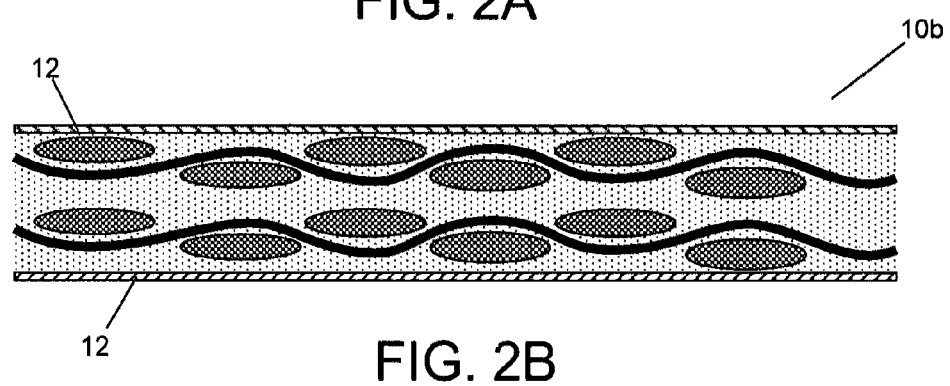
FIG. 2B is a schematic cross sectional view of a material that includes multiple plies of resin impregnated carbon fiber cloth, that is clad on both sides with layers of metal and that can be used as a core layer within a PWB substrate in accordance with another embodiment of the invention.
Figure 2C:
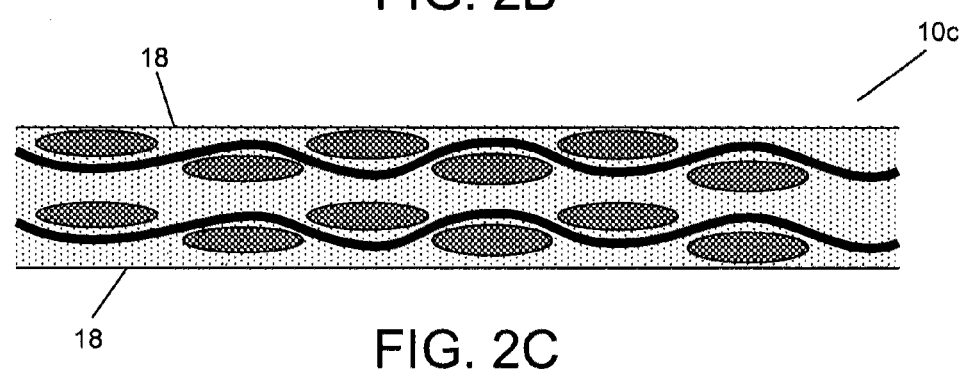
FIG. 2C is a schematic cross sectional view of a material including multiple plies of resin impregnated carbon fiber cloth that is not clad and that can be used as a core layer within a PWB substrate in accordance with a further embodiment of the invention.

A cross-sectional view of a layer of material that can be used in the construction of a core layer of a PWB substrate in accordance with an embodiment of the invention is shown in FIG. 2A. The layer of material 10a includes layers of carbon fiber tow 16 impregnated with resin material 14 sandwiched between two layers of metal or other electrically conductive material 12. The resin matrix 14 can be composed of resin chemistry and inorganic filler dispersed in the resin chemistry. The types of resin and the inorganic materials that can be used in accordance with embodiments of the invention are discussed further below. The layer of material 10b shown in FIG. 2B is similar to the layer of material 10a shown in FIG. 2A with the exception that the layer of material 10b shown in FIG. 2B includes multiple plies of carbon fiber tow 16 impregnated with resin material 14 to increase the thickness of the constraining core structure. In other embodiments, more than two layers of carbon fiber tow 16 are used. The layer of material 10c shown in FIG. 2C is similar to the layer of material 10b shown in FIG. 2B with the exception that the layer of material 10c shown in FIG. 2C is not clad with layers of metal.

Figure 2D:
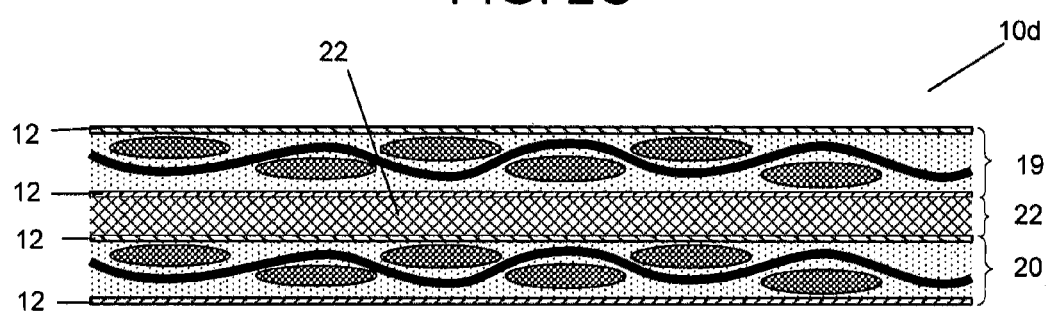
FIG. 2D is a schematic cross sectional view of a material including a first portion and a second portion, where the first portion is electrically isolated from the second portion by a dielectric layer and that can be used as a core layer within a PWB substrate in accordance with still another embodiment of the invention.

The layer of material 10d shown in FIG. 2D includes a first electrically conductive layer 19 that is electrically isolated from a second electrically conductive layer 20 by a dielectric layer 22. The first and second electrically conductive layers are constructed from layers of material similar to the layer of material 10a shown in FIG. 2A. The dielectric layer 22 servers to both electrically isolate the first and second electrically conductive layers and to bond the two layers together. The dielectric layer 22 can be constructed from any dielectric material with the mechanical properties required for the particular application in which the layer of material 10d is intended for use. In several embodiments, the first electrically conductive layer 19 is used within the core layer of a PWB substrate as a first functional layer and the second electrically conductive layer 20 is used a second functional layer within the PWB substrate. In other embodiments, the first and second electrically conductive layers are electrically connected to each other via plated through holes.

In several embodiments, the first electrically conductive layer 19 and the second electrically conductive layer 20 are laminated together with a layer of dielectric material 22 prior to commencement of the manufacture of a PWB substrate. In other embodiments, the first electrically conductive layer 19 and the second electrically conductive layer 20 are processed separately (including performing clearance hole drilling) and then laminated together with a dielectric material during the manufacture of a PWB substrate.

Materials Used to Construct Core Layers

A variety of materials can also be used in the construction of core layers of PWB substrates in accordance with embodiments of the invention. In many embodiments, woven carbon fiber (usually with a balanced weave) that is impregnated with resin and clad on one or more sides with metal is used. In other embodiments, one or more layers of material that include a conductive laminate that is clad or unclad can be used to construct a core layer. The laminate can be made of a base material impregnated with resin.

Often the base material is a fibrous material such as carbon fiber, graphite fibers such as CN-80, CN-60, CN-50, YS-90 manufactured by Nippon Graphite Fiber of Japan, K13B12, K13C1U, K63D2U manufactured by Mitsubishi Chemical Inc. Japan, T300-3k, T300-1k manufactured by Cytec Carbon Fibers LLC of Greenville, S.C. Often the fibrous material is coated with metal prior to impregnation with resin. An example of metal coated fibers includes carbon, graphite, E-glass, S-glass, Aramid, Kevlar, quartz or any combinations of these fibers. Often the fibrous material can be continuous carbon fiber. Alternatively, the fibrous material can be discontinuous carbon fiber. Discontinuous fibers such as spin broken fibers (X0219) manufactured by Toho Carbon Fibers Inc, Rockwood, Tenn., USA, Stretched broken carbon fiber (SBCF) manufactured by Hexcel corporation, Utah, USA. Fibrous material can be woven or non-woven. Non-woven material can be in a form of the Uni-tape or a mat. The carbon mat can be grade number 8000040 and 8000047, which are 2 oz and 3 oz respectively, manufactured by Advanced Fiber NonWovens, East Walpole, Mass. In addition, the carbon fibers can be PAN based carbon fiber, Pitch based carbon fiber or a combination of both fibers.

Layers of non-fibrous materials can also be used in the construction of core layers of PWB substrates in accordance with embodiments of the invention. For example, a core layer can be constructed from a solid carbon plate. Solid carbon plates can be made using compressed carbon or graphite powder. Another approach is to make a solid carbon plate using carbon flakes or chopped carbon fiber with a thermo, plastic or thermo setting binder.

A core layer in accordance with embodiments of the invention can also be constructed using carbon nanotubes impregnated with polymer. The carbon nanotubes can be single walled carbon nanotubes such as carbon single walled nanotubes (C-SWNT) manufactured by Raymor Industries Inc. of Canada, or carbon nanotubes developed by the National Institute of Advanced Industrial Science and Technology (AIST) in Tsukuba, Japan. Single walled carbon nanotubes are forms of pure carbon that can be 100 times stronger than steel at $\frac{1}{6}^{th}$ the weight. C-SWNT can also conduct electricity up to 1,000 times faster than copper. The current density of carbon nanotubes can be $10^9$ A/cm$^2$ (i.e. 1000× greater than copper). C-SWNT can also transfer heat at a rate 10 times greater than copper. Carbon nanotubes can be manufactured employing a Plasma Process, Chemical Vapor Deposition (CVD) chemical process, Gas Phase CVD process, Arc Discharge method or Laser Ablation process. Carbon nanotubes can be of <1-100 nm in diameter and <2000 nm in length. All these very unique physical, electrical and thermal properties can result in core layers that are well suited for inclusion in PWB substrates in accordance with embodiments of the invention.

Another useful material that can be used in the construction of a core layer in accordance with embodiments of the invention is C—SiC (Carbon-Silicon Carbide), which is manufactured by Starfire Systems Inc. of Malta, N.Y.

A variety of resins can be used in the construction of core layers in accordance with embodiments of the invention including Epoxy, Bismaleimide Triazine (BT), Bismaleimide (BMI), Cyanate ester, Polyimide, Phenolic, polyamide imide, polyacrylate, polyphenylene sulfide, tetrafluroethylene, polysulfone, polyphenylsulfone, polyethersulfone, polyphthalamide, polyacetal, polyketone, polycarbonate, polyphenylene oxide, polyether ether ketone or a combination of some of the above. In many instances, the resin can include an inorganic filler like pyrolytic carbon powder, carbon nanoparticles, carbon nanotubes (diameters ranging from <1-100 nm), carbon single walled nanotubes (C-SWNT), carbon powder, carbon particles, diamond powder, boron nitride, alumina, aluminum oxide, aluminum nitride, aluminum hydroxide, magnesium hydroxide, silica powder and ceramic particles to improve physical, mechanical electrical and thermal properties. The resin composite may contain between 2 and 80 percent by weight of the inorganic filler. The filler particle size is typically less than 25 µm.

In another embodiment, layer of constraining core material is not limited to a carbon composite. Any material that can result in a dielectric constant of the constraining core that is greater than 6.0 at 1 MHz can be used in the construction of a core layer in accordance with embodiments of the invention.

Electrical Conductivity of Core Layers

The electrical conductivity of a core layer varies depending upon its construction. Carbon materials such as the carbon fibers and carbon plates described above are electrically conductive but are typically not conductive enough to carry the electrical load required for a core layer to act as a functional layer of a PWB substrate. Therefore, metal and/or an electrically conductive filler can be used to increase the electrical load that can be carried by a core layer. For example, a core layer can be constructed from metal coated graphite fibers with toughened epoxy and/or graphite fibers impregnated with toughened epoxy resin that has carbon nanotubes or pyrolytic carbon powder as a filler material. In many embodiments, a metal layer such as a copper layer is clad on either side of the core layer to increase the electrical conductivity of the constraining core.

Figure 2E:
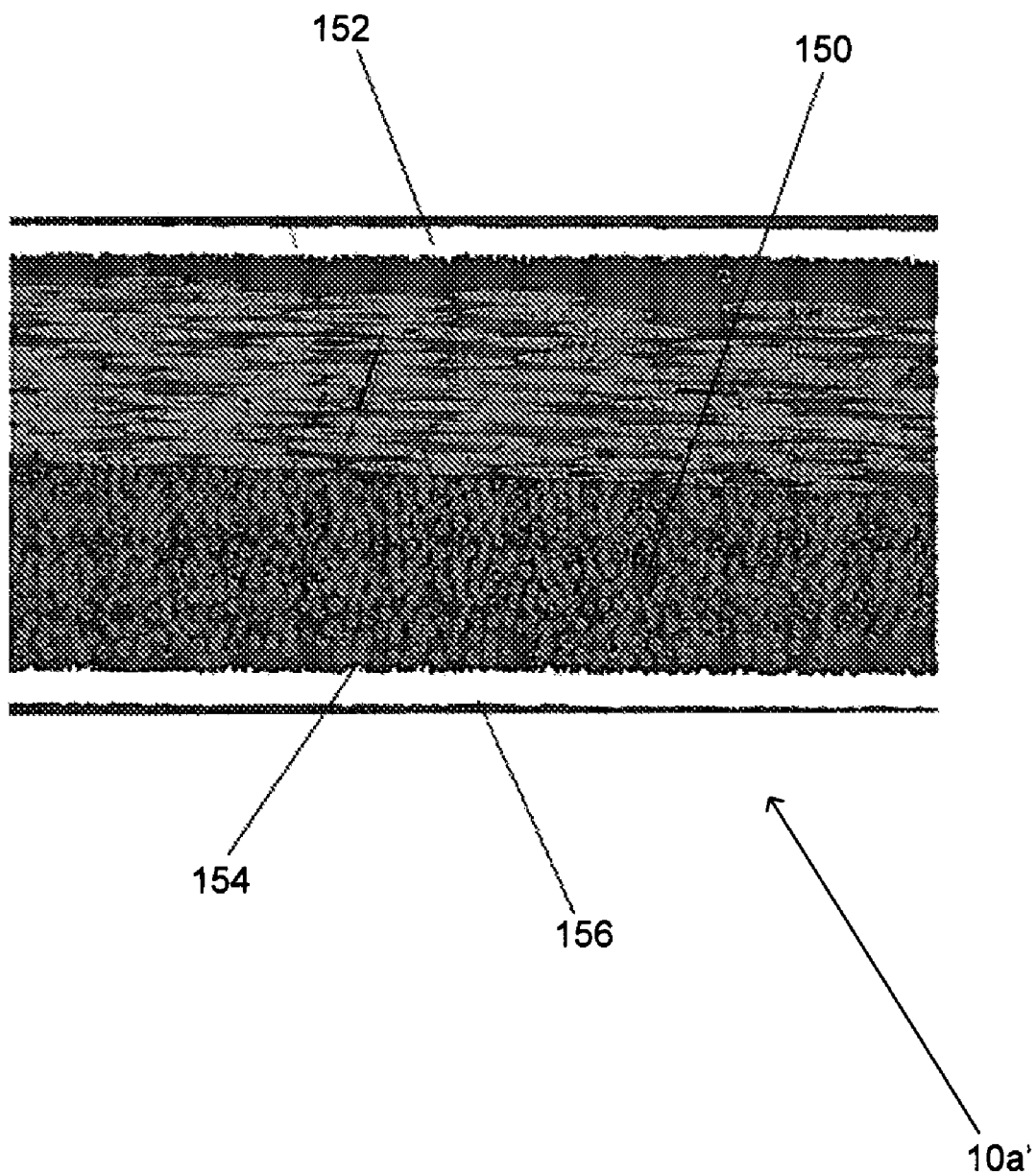
FIG. 2E is a photograph captured using an electron microscope that shows a resin impregnated layer of woven carbon fiber cloth clad on both sides with layers of metal that include protrusions (dendrites) extending from the interior surface of the layers of metal and directly contacting a number of the carbon fibers.

In embodiments where metal cladding is bonded by resin to an electrically conductive fibrous material, such as carbon fiber or metal coated fibers, an electrical connection can be established between the metal cladding and the electrically conductive fibrous material. In a number of embodiments, the electrical connection is facilitated by layers of metal that include protrusions (dendrites) on the surface of the layer of metal that is proximate the electrically conductive fibers. A photograph taken using an electronmicroscope that shows a layer of material including woven carbon fiber impregnated with resin and clad on both sides with layers of metal that have one roughened surface with protrusions (dendrites) that extend towards the woven carbon fibers in accordance with embodiments of the invention is shown in FIG. 2E. The layer of material 10a' includes woven carbon fiber 150. The woven carbon fiber is impregnated with a resin (invisible in the photograph) that bonds the woven carbon fiber 150 to layers 152 of metal. The layer of metal includes a roughened surface with metal protrusions or dendrites 154 and a smooth surface 156. The roughened surface is positioned inwardly so that the metal protrusions 154 extend toward the woven carbon fibers 150. A number of the woven carbon fibers contact the metal protrusions creating electrical connections between the woven carbon fiber and the layers of electrically conductive metal. The electrical connection between the woven carbon fiber and the layers of electrically conductive metal can increase the electrical load that can be carried by a core layer constructed from the material 10a'. The second or outer surfaces of the layers of metal are smooth, because these surfaces are the foundations of build-up wiring portions. The dielectric layers used in the construction of build up wiring portions are typically so thin that unevenness in the outer surface of metal can prevent the reliable construction of micro wiring layers during the build-up process.

Mechanical Properties of the Core Layer

The selection of the materials used in the construction of a core layer in accordance with an embodiment of the invention typically also depends on the desired mechanical properties of the PWB substrate at the final product level. These properties can include heat transfer rate, coefficient of thermal expansion, and stiffness. In a number of embodiments, a layer of material is used in the construction of a core layer that has a CTE of between 0 ppm/° C. and 12 ppm/° C. in the surface spreading direction. In several embodiments, a layer of material is used in the construction of a core layer that has a CTE of between 0 ppm/° C. and 9 ppm/° C. in the surface spreading direction. In a number of embodiments, a layer of material is used in the construction of a core layer that has a CTE of between 30 ppm/° C. and 100 ppm/° C. in the surface normal to the spreading direction. In many embodiments, a layer of material is used in the construction of a core layer that has a CTE of between 35 ppm/° C. and 75 ppm/° C. in the surface normal to the spreading direction.

In several embodiments, a layer of material is used in the construction of a core layer that has a thermal conductivity of between 2 W/m.K and 500 W/m.K in the surface spreading direction. In many embodiments, a layer of material is used in the construction of a core layer that has a thermal conductivity of between 50 W/m.K and 1000 W/m.K in the surface spreading direction.

In a number of embodiments, a layer of material is used in the construction of a core layer that has a tensile modulus of between 5 msi (millions of pounds per square inch) and 35 msi in the surface spreading direction. In many embodiments, a layer of material is used in the construction of a core layer that has a tensile modulus of between 10 msi and 40 msi in the surface spreading direction.

In a broad sense, any combination of the materials described above can be used in the construction of a constraining core that results in a laminate layer having a dielectric constant that is greater than 6.0 at 1 MHz and that results in a PWB substrate having desired physical properties.

Manufacturing a PWB Substrate

Figure 3:
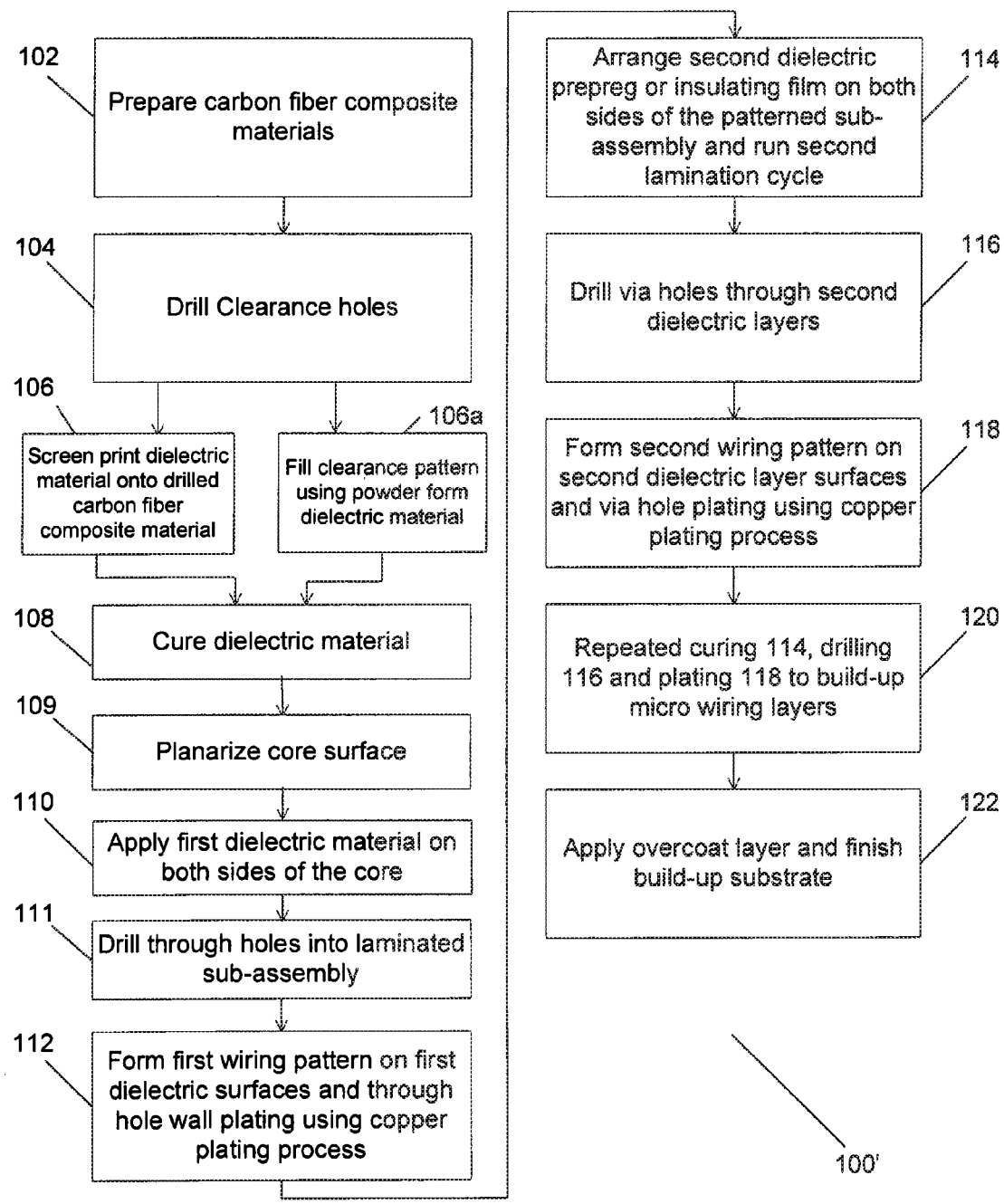
FIG. 3 is a flow chart illustrating a process for manufacturing a build-up multilayer PWB substrate including a core layer that forms part of the PWB substrate circuit in accordance with an embodiment of the invention.

A process for constructing a build-up PWB substrate in accordance with an embodiment of the invention is illustrated in FIG. 3. The process 100 includes preparing a layer of core material (102) that will form a core of the PWB substrate. The layer of core material is then drilled (104) with any necessary clearance holes in accordance with a PWB substrate design. The clearance holes are then filled with resin. In a number of embodiments, the clearance holes are filled by screen printing (106) dielectric material into the drilled layer of core material. In many embodiments, a powder form dielectric material is used to fill (106a) the clearance holes. The dielectric is cured (108) planarized and a bond promoting surface treatment is applied to the layer of metal that is bonded to the layer of core material (109). The bond promoting surface treatment (such as a microetching process) roughens the surface of the layer of metal to create a three dimensional bond that can tolerate higher shear stresses caused by CTE differences between the core layer and the build-up wiring portions than the planar bond, which would be created with a smoother surface. Planarizing refers to the process of removing unevenness in the surface of the core layer that is the result of cured resin protruding from clearance holes. Bumps on the surface of the core layer can create irregularities throughout the build-up wiring portions, which can compromise the layout of micro wiring layers in the build-up wiring portions. Therefore, planarizing the layer of core material can increase manufacturing yields. The drilled layer of core material and a pair of first dielectric layers are then arranged (110). Typically, a first dielectric layer is positioned on each side of the drilled layer of core material. The sandwich is then cured and/or laminated under pressure, temperature and for a time specified by the manufacturer of the first dielectric layers to form a laminate sub-assembly. Through holes are then drilled (111) through the laminate sub-assembly and micro wiring patterns are formed (112) on the upper and lower surfaces of the first dielectric layers using a copper plating process. The copper plating process also plates the through holes. A second pair of dielectric layers is then arranged (114) relative to the upper and lower surfaces of the patterned laminate sub-assembly and run through a second curing and/or lamination cycle. Once the second lamination and/or cure cycle is complete, micro-via holes are drilled (116) through the second pair of dielectric layers. The via holes may be formed by dry etching processes that use a $CO_2$ laser, a UV laser, an excimer laser and/or a plasma. A micro wiring pattern is then formed (118) on the upper and lower surfaces of the second pair of dielectric layers using a copper plating process. The copper plating process also plates the linings of the vias. Repeated lamination and/or cure cycle (114), drilling (116) and plating (118) of pairs of dielectric layers can be performed (120) to build the required number of micro wiring layers. An overcoat is then applied (122) and the build-up PWB substrate completed.

Subassemblies Created During Manufacture of Build-Up PWB Substrate

Materials and substrate subassemblies that are utilized during the manufacturing process shown in FIG. 3 in accordance with an embodiment of the present invention are illustrated in FIGS. 4A-4M. First as, shown in FIG. 4A, a layer of core material is prepared. In the illustrated embodiment, a layer of core material 10b that includes carbon fiber reinforced with resin sandwiched between two metal layers 12 is prepared. The layer of core material 10b is constructed using multiple layers of carbon fiber cloth. In many embodiments, the layer of metal can be thin copper foils having a thickness of between 5 μm-140 μm.

A layer of core material in which clearance holes and/or slots have been drilled is shown in FIG. 4B. The clearance holes 25 and/or slots are formed in at prescribed locations. Clearance holes 25 in accordance with embodiments of the invention can be made by mechanical drilling, laser drilling, laser cutting, punching or high pressure water jet cutting or equivalent methods.

Each of the clearance holes 25 has a first diameter and each plated through hole that passes through a clearance hole has a second smaller diameter. When a plated via possessing a diameter less than the diameter of a resin filled clearance hole is drilled through the center of the resin filled clearance hole, the resin surrounding the plated via electrically isolates the lining of the via from the electrically conductive constraining core. During manufacture, the extent of tolerable misalignment between the centers of the resin filled clearance holes and the plated through holes is determined largely by the difference between the diameters of the resin filled clearance holes and the diameters of the plated through holes. In situations where misalignment results in a portion of the plated via contacting the electrically conductive constraining core, then an unintended electrical connection between the lining of the via and the electrically conductive constraining core results. In many embodiments the first diameter is greater than the second diameter by between 0.004" and 0.020". In many embodiments, multiple through holes are drilled through slots formed in the layer of core material. Similar care during manufacturing should be applied to ensure that sufficient separation exists between plated through holes located within the slots and the electrically conductive materials in the layer of core material.

When a constraining core layer is used as a functional layer such as ground, power and/or split plane layer of the circuit, it is not required to drill clearance holes at all the through hole locations. By design, some of the plated through holes are required to make electrical contact with constraining core. Reducing the number of clearance holes drilled in the layer of core material can positively impact the mechanical properties of layer of core material when it is included as the core layer of a PWB substrate.

Figure 4D:
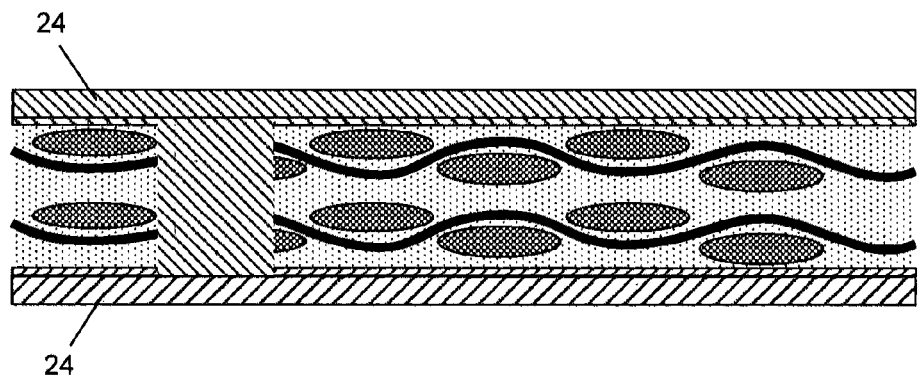

The formation of a laminated sub-assembly including a pair of dielectric layers bonded to the upper and lower surfaces of a layer of core material in accordance with an embodiment of the invention is shown in FIGS. 4C', 4C'' and FIG. 4D. A layer of core material in which dielectric has been screened into clearance holes in accordance with an embodiment of the invention is shown in FIG. 4C'. Resin 26 can be screened into clearance holes 25 and/or slots using either a vacuum screening process or a vacuumless screening process. In many embodiments, the resin screened into the clearance holes and/or slots is a high viscosity liquid such as Part No. PHP-900-IR-10F or Part No. PHP-900-IR-10FE resin manufactured by San-EI Kagaku Company Limited of Japan. In other embodiments, any suitable high viscosity liquid or paste that can meet dielectric properties or any dielectric resin powder that can be used to fill an appropriately dimensioned cavity can be used to fill a clearance hole and/or slot. A planarized layer of core material in accordance with an embodiment of the invention is shown in FIG. 4C''. As discussed above, planarizing involves removing resin protruding from clearance holes to create planar surfaces. In many embodiments, the resin is cut away. A B-stage thermosetting resin material 24 or glass reinforced prepreg is applied to both the upper and lower surfaces of the processed layer of core material 10b, and cure and/or laminated under temperature, pressure and time to provide a laminated sub-assembly including C-stage upper and lower dielectric layers 24 (see FIG. 4D). During this lamination process, the clearance holes 25 and/or slots are filled with reflowed resin from B-stage dielectric layers 24. The applied resin material can be one of the resins described above with respect to the constraining cores 10.

Figure 4E:
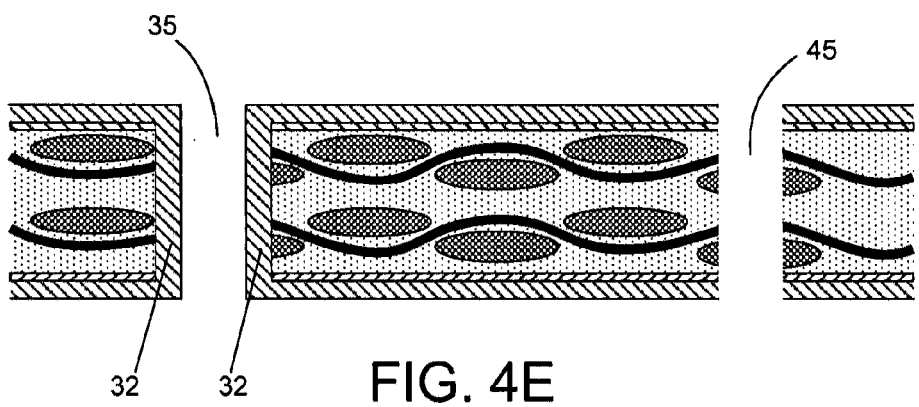

A laminated sub-assembly in which plated through holes have been drilled in accordance with an embodiment of the invention is shown in FIG. 4E. Through holes 35, 45 are formed at prescribed locations. A first plated through hole 35 is formed in a position that passes through a resin filled clearance hole 25 formed in the layer of core material. The first plated through hole 35 is drilled so that the cylindrical axis of the through hole 35 is concentric to the cylindrical axis of the resin filled clearance hole. The diameter of the through hole 35 is smaller than that of the resin filled clearance hole 25. Since the diameter of the through hole 35 is smaller than the diameter of the resin filled clearance hole 25, a cylindrical insulating sheath 32 is formed around the wall surface of the through hole 35 that prevents electrical connection between a plating lining 34 of the through hole 35 and electrically conductive material in the layer of core material. Through holes are also formed at positions where the clearance holes do not intersect a resin filled clearance hole or resin filled slot. Thus, plating on the interior lining of a second plated through hole 45 is in direct electrical contact with electrically conducive materials in the layer of core material. As discussed above, formation of the through holes 35, 45 can be performed by mechanical drilling, laser drilling, laser cutting, punching, high pressure water jet cutting or equivalent methods, a dry etching process including processes that use a $CO_2$ laser, a UV laser, an excimer laser or a plasma.

Figure 4F:
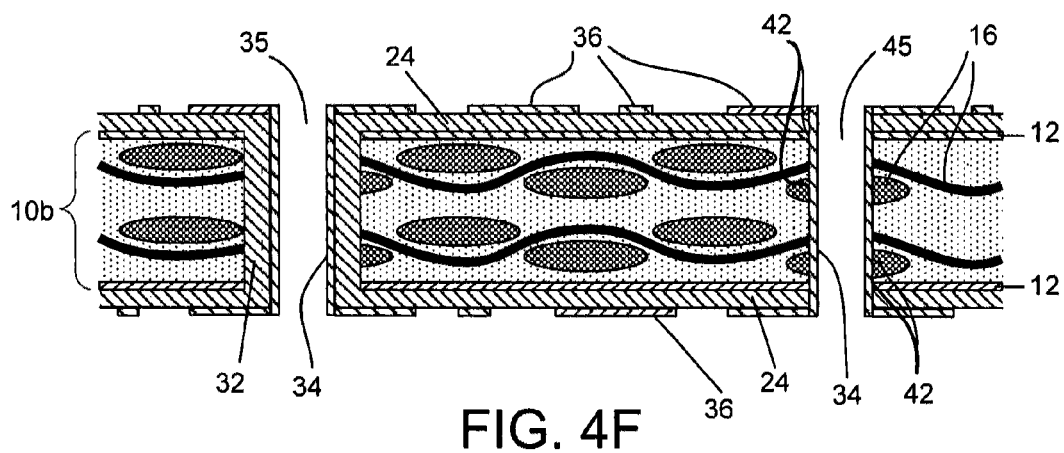

A micro wiring layer formed on the outer surfaces of a drilled sub-assembly in accordance with an embodiment of the invention is shown in FIG. 4F. A micro wiring layer 36 can be formed on each of the upper and the lower surfaces of the dielectric layers 24 by a semi-additive process. The semi-additive process can also plate the interior surfaces of through holes 35, 45 drilled through the laminate sub-assembly. In a number of instances, the plating creates an electrical connection between a plated through hole 45 and electrically conductive materials in the layer of core material 10b. In the illustrated embodiment, an electrical connection is established between the electrically conductive materials in the layer of core material 10b and the plating 34 of the through hole 45. In the illustrated embodiment, the plating of the plated through hole 45 electrically connects with the carbon fiber and the cladding of the core layer.

In a number of embodiments, the subassembly shown in FIG. 4F is subject to a number of processing steps. In particular, the surface of the first pair of dielectric layers 24 and through holes 35, 45 are processed as follows. A desmear process is applied to remove any resin debris and the dielectric layers are plated with a very thin base layer of copper using an electroless process. Then, a resist pattern is formed on the base copper layer. The resist pattern has masking and non-masking portions. The through holes 35, 45 are exposed at the non-masking portions. An electroplating process is performed to obtain a desired thickness of copper for circuits that form the micro wiring layer and the plating of the through hole walls 34. The resist pattern can be removed by a chemical developing process to further expose the base copper layer, which is then removed by a chemical etching process. At the completion of these processes a micro wiring layer 36 is formed on each of the exterior surfaces of the first pair of dielectric layers 24 and the interior surfaces of the through holes 35, 45 are plated with an electrically conductive material. In other embodiments, other processes that can form micro wiring layers and plate through holes can be used. Further, through holes 35 and 45 can be filled with conductive or non-conductive material and planarized for further processing.

Figure 4G:
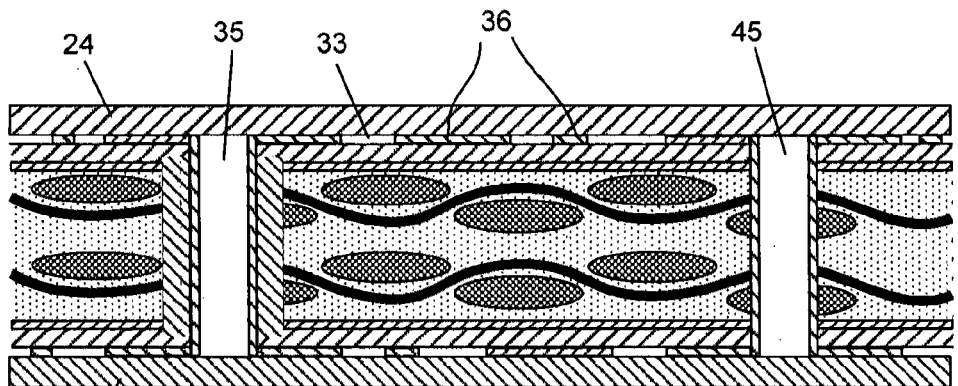

Turning now to FIG. 4G, a second pair of dielectric layers 24 are placed covering the micro wiring patterns 36 on both sides of the sub-assembly. The curing and/or lamination of the arrangement shown in FIG. 4G and subsequent processes performed to the cured/laminated arrangement in accordance with embodiments of the invention are similar to processes performed to build-up layers on conventional PWB substrates.

Figure 4H:
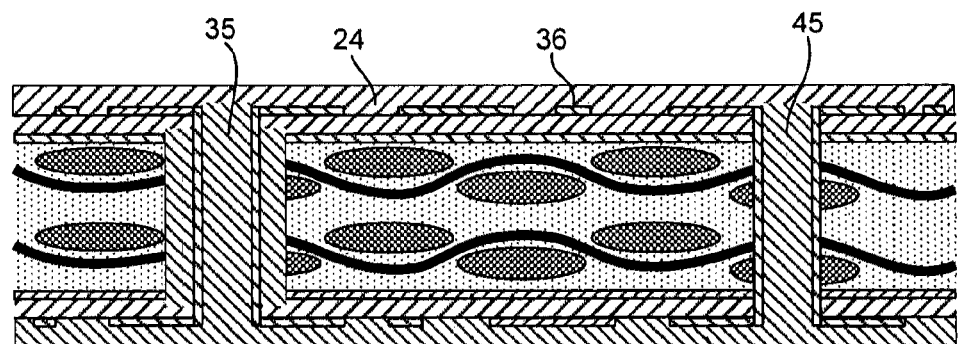

The arrangement shown in FIG. 4G following a curing and/or lamination cycle performed under temperature, pressure, time and vacuum is illustrated in FIG. 4H. Gaps between the circuits on the micro wiring layers 36 are filled by resin that reflowed from the dielectric layers 24 during the lamination cycle.

Figure 4I:
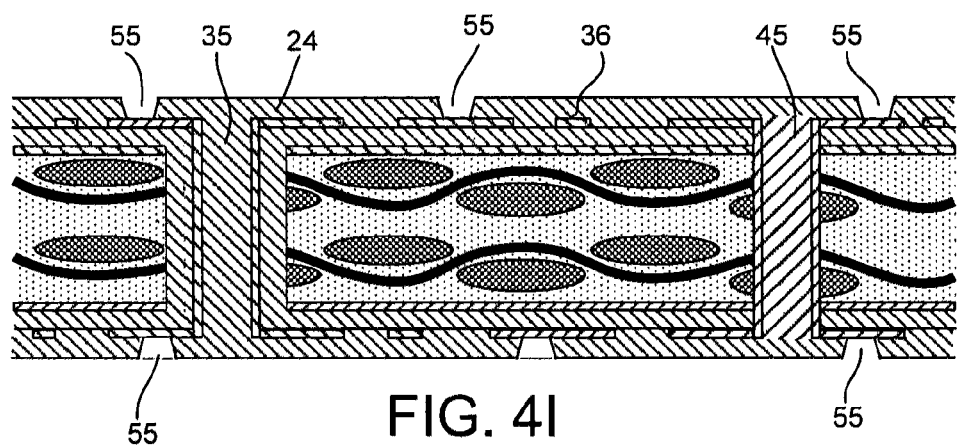

Via holes formed in the laminated sub-assembly shown in FIG. 4H is shown in FIG. 4I. Via holes 55 are formed in the second pair of dielectric layers 24. Different via patterns can be drilled in each of the second pair of dielectric layers 24. Vias 55 can be formed using a dry etching process involving a CO2 laser, a UV laser, an excimer laser or a plasma. Other processes also can be employed, such as using photosensitive second dielectric layers followed by a photolithography process.

Figure 4J:
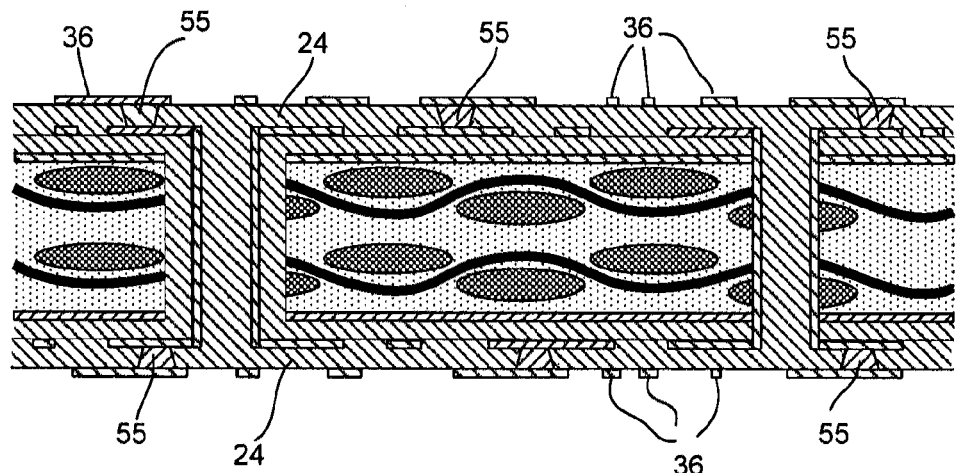

A subassembly including plated vias and a second pair of micro wiring layers in accordance with an embodiment of the invention is shown in FIG. 4J. Applying processes similar to the processes used to obtain the sub-assembly shown in FIG. 4F results in the plating of the vias 55 shown in FIG. 4H and the formation of a pair of micro wiring layers 36 on the outer surfaces of the second pair of dielectric layers 24.

Figure 4K:
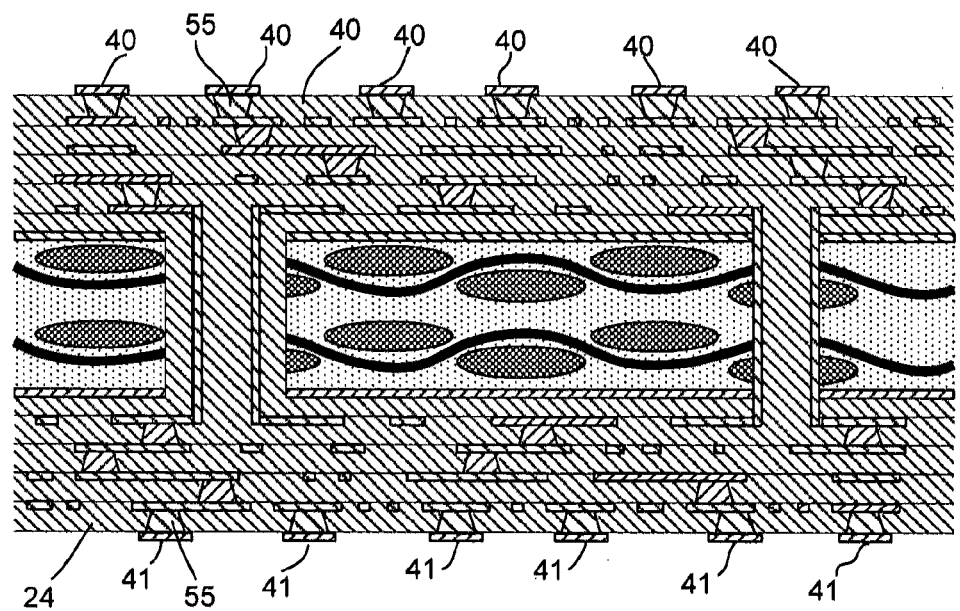

Manufacture of a multi-layer build-up PWB in accordance with embodiments of the invention can involve repeating the process described in relation to FIGS. 4G-4J a pre-defined number of times. An example of a sub-assembly constructed in this way is shown in FIG. 4K. The outermost layers of the sub-assembly include a plurality of the electrical connection pads 40, 41 that can be used to establish connections between the PWB substrate and a semiconductor die and between the PWB substrate and second-level packaging such as a conventional PWB. Bump pads 40 are formed on the outer surface of the PWB substrate to which a semiconductor die is to be attached. Ball pads 41 are formed on the outer surface of the PWB substrate that is to be connected to a second-level package such as a conventional PWB. In many embodiments, the bump pads 40 and the ball pads 41 are coated with additional metal plating such as Nickel, Gold, Silver and/or Tin to improve the characteristics of the electrical achieved with the pin pads of a semiconductor die or with contacts on a conventional PWB.

Figure 4L:
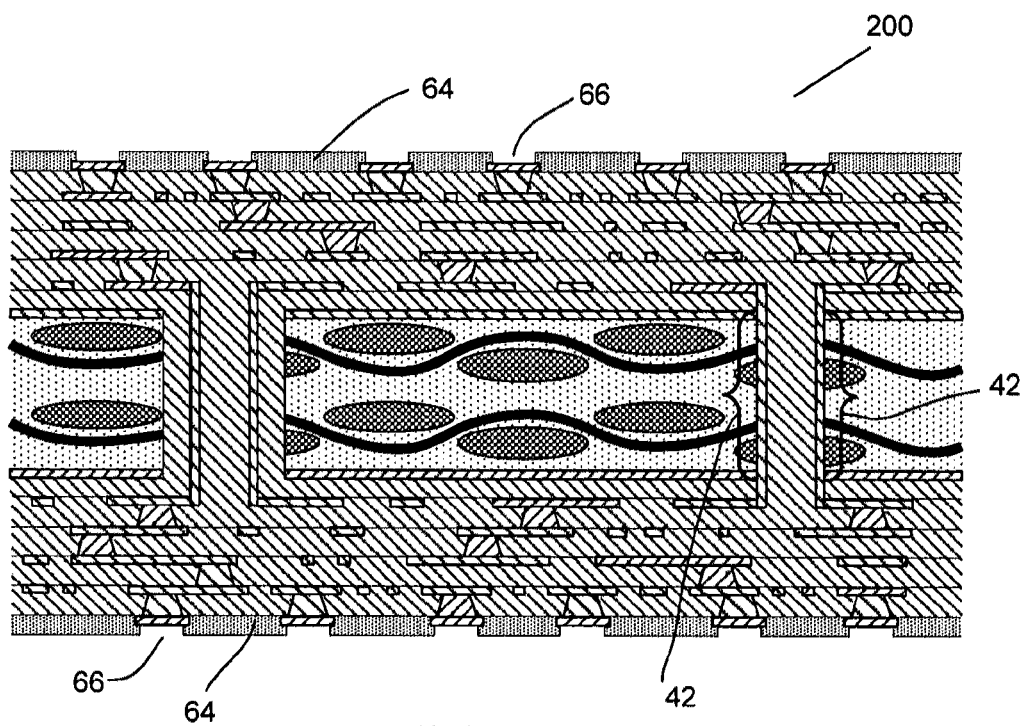

A finished PWB substrate in which overcoat layers 64 are applied to the upper and lower surfaces of the PWB substrate in accordance with an embodiment of the invention is shown in FIG. 4L. The overcoat layers 64 are formed with openings 66 exposing electrical connection pads 40, 41. The formation of the overcoat layer may proceed as follows. A suitable highly insulating and heat resistive material is applied on both surfaces of the substrate by a printing or screening method. Then photolithography processes can be used to pattern openings 66. In other embodiments, any of a variety of processes for applying overcoat layers to conventional PWB substrates can be used to form the overcoat layers 64.

Through the above described process, a multilayer build-up PWB substrate can be manufactured, which includes a core layer that is part of the circuit of the PWB substrate, a multilayer micro wiring pattern, plated through holes, vias and protective overcoats. In many embodiments, the thickness of the core layer is between 0.002" and 0.100". In several embodiments, the thickness of the core layer is between 0.010" and 0.050".

In a number of embodiments, the thickness of the core layer is between 30% and 90% of the finished PWB substrate thickness. In several embodiments, the thickness of the core layer is between 40% and 60% of the finished PWB substrate thickness.

In many embodiments, the ratio of the core layer to other materials used in the construction of the PWB substrate that includes the core layer is 60/40. In a number of embodiments, the ratio 70/30.

PWB Substrates Including Core Layers with Multiple Plies of Fibrous Material

A variety of layers of material can be used to construct cores of PWB substrates in accordance with embodiments of the invention. A PWB substrate similar to the PWB substrate shown in FIG. 4M can be constructed that includes a layer of core material similar to the layer of material 10c shown in FIG. 2c. As discussed above, the core layer 10c includes multiple plies of fibrous material and does not include layers of metal. In the described embodiment, the electrical conductivity of the core layer 10c is sufficient for the core layer 10c to act as a functional layer given the electrical load demands of the application for which the PWB substrate is intended.

PWB Substrates Including Core Layers with Multiple Functional Layers

Figure 4M:
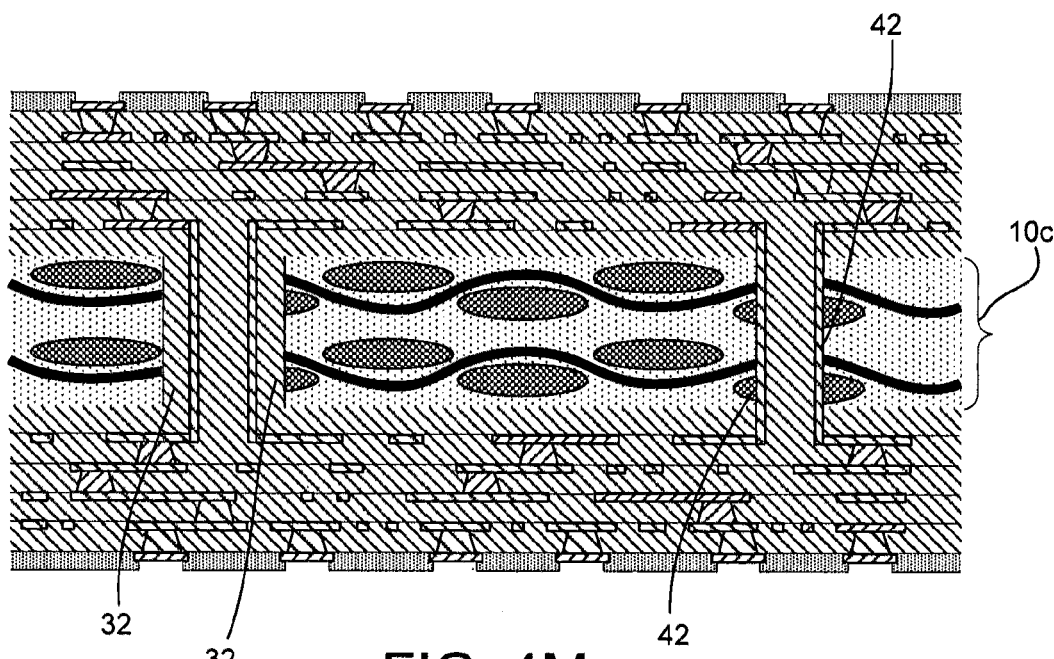

A PWB substrate similar to the PWB substrate shown in FIG. 4M that includes a layer of core material similar to the layer of material 10d shown in FIG. 2D is illustrated in FIG. 5. As described above, the core layer 10d includes a thin layer of dielectric material that separates two electrically conductive layers that can each act as a functional layer of the PWB substrate. Thus, the core layer 10d can serve as two functional layers in addition to providing mechanical advantages such as reducing the CTE of the PWB substrate. Plated through holes 65, 75 and 85 pass through the core layer 10d. The plated through hole 65 is isolated from both of the electrically conductive layers 60 and 70 in the core layer 10d by cylindrical dielectric sheaths 32 formed by resin filled clearance holes. The plated through hole 75 is isolated from the first electrically conductive layer 60 in the core layer 10d by a cylindrical dielectric sheath 32 formed by a resin filled clearance hole. However, an electrical connection 42 exists between the plated wall 34 of the through hole 75 and the second electrically conductive layer 70 in the core layer 10d. The plated through hole 85 is electrically connected to the first electrically conductive layer 60 and electrically isolated from the second electrically conductive layer 70. As discussed above, both electrically conductive layers serve as functional layers within the substrate. In the illustrated embodiment, the first layer of electrically conductive material can act as a power plane and the second layer of electrically conductive material can act as a ground plane or vice versa. Alternatively, both layers could act as power planes, ground planes or split planes.

In many embodiments, the thickness of the dielectric layer 22 included in the core layer 10d is between 0.001" and 0.030". In addition to the dielectric layer 22, dielectric material can also be used to electrically isolate the edges of the electrically conductive layers 60, 70 to prevent the layers shorting at the edges of the PWB. In a number of embodiments, the edges can be electrically isolated by routing or drilling resin filled channels along the edges to create a barrier of resin between the electrical materials in at least one of the electrically conductive layers and the edge of the core layer 10d.

Figure 6:
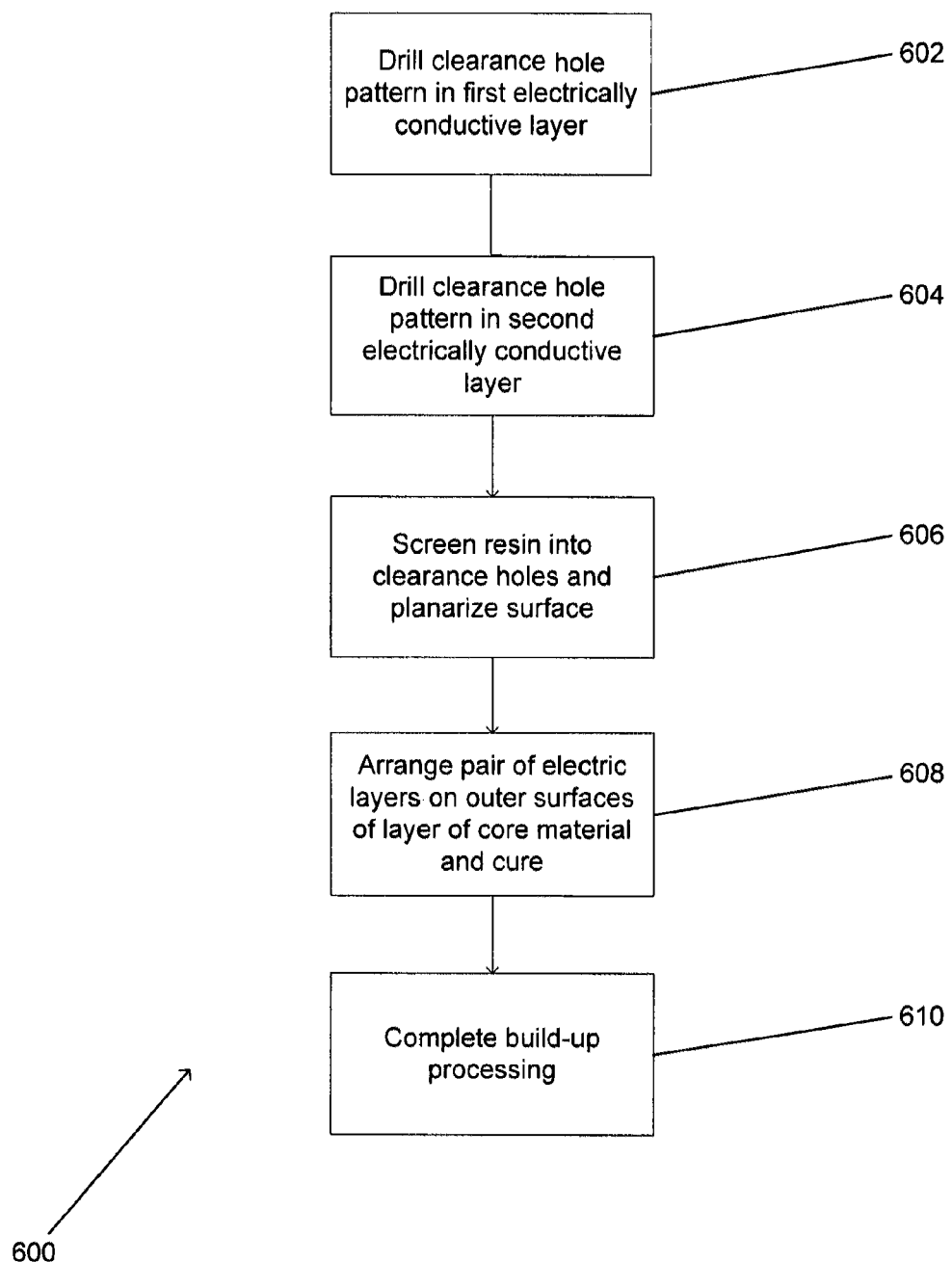
FIG. 6 is a flow chart of a process for constructing a PWB substrate similar to the PWB substrate shown in FIG. 5.

A process for manufacturing a PWB substrate that includes a core layer similar to the layer of material 10d shown in FIG. 2D, which includes first and second electrically conductive layers, in accordance with an embodiment of the invention is shown in FIG. 6. The process 600 includes drilling (602) a clearance hole pattern through the first electrically conductive layer using a drilling process such as control depth drill process, which can involve $CO_2$ laser drilling, UV laser drilling, a combination of UV and $CO_2$ laser drilling, excimer laser drilling or plasma drilling. A clearance hole pattern is then drilled (604) through the second electrically conductive layer using a similar drilling process. As discussed above, the clearance hole drilling pattern can include channels routed or drilled along lines that will ultimately form the edges of the core layer of a PWB substrate. The resin filled channels can prevent short circuits at the edges of the electrically conductive layers. In a number of embodiments, a pair of parallel channels is formed in each electrically conductive layer. In many embodiments; a pair of perpendicular channels is formed in each electrically conductive layer. When drilling, the holes and channels typically do not extend into the dielectric material that bonds the first and second electrically conductive layers. In a number of embodiments, high viscous resin material is screened (606) into the clearance holes and channels and the layer is planarized core material. Viscous resin materials and screening processes similar to those described above can be used to fill the clearance holes. In other embodiments, resin reflow is relied upon to fill the clearance holes. A first pair of dielectric layers 24 is arranged (608) on both sides of the layer of core material 10d and lamination is performed. The build-up process can then be completed (610) using processes similar to those described with respect to process shown in FIG. 3.

In other embodiments, each electrically conductive layer 60, 70 is processed prior to combination with a dielectric layer 22 to form a layer of core material 10d. The processing typically involves drilling clearance hole patterns in each electrically conductive layer 60, 70 and arranging a stack-up including a first lower dielectric layer 24, the second electrically conductive layer 70, a dielectric layer 22, the first electrically conductive layer 60 and a first upper dielectric layer 24 in direction normal to the surface spreading direction. A curing and/or lamination cycle is then performed under temperature, pressure, time and vacuum. Dielectric resin from the upper dielectric layer 24, dielectric layer 22 and lower dielectric layer 24 reflows into the clearance holes during curing/lamination (the clearance holes can also be filled with resin prior to curing/lamination). A finished PWB substrate can then be completed using processes similar to those outlined above with respect to FIG. 3.

Designing for Reduced CTE

A core layer 10 in a PWB substrate in accordance with an embodiment of the invention typically has a small CTE in the surface spreading direction. In many embodiments, the use of carbon fiber tows in the core layer 10 that extended parallel to the surface spreading direction contribute to the small CTE of the core layer 10.

The CTE of a PWB substrate in accordance with embodiments of the invention depends significantly on the CTE of the constraining core layer 10. Therefore, it is possible to increase or decrease the co-efficient of thermal expansion of a PWB substrate in the surface spreading direction by adjusting the amount of carbon fiber material, carbon fiber type, and carbon fiber tow size used in the core layer 10. For example, CTE ranges of between 3 ppm/° C. and 12 ppm/° C. can be attained for a PWB substrate by modifying these features of the PWB substrate's core layer. A PWB substrate with a CTE in surface spreading direction within this range can match to or substantially match the CTE of a semiconductor chip in its parallel surface spreading direction that is mounted to the PWB substrate. Material in the core layer that is removed during the drilling of clearance holes can impact the CTE of the core layer. The more material removed, the higher the CTE of the core layer. When clearance holes are closely spaced, the removal of material can significantly impact the mechanical properties of the core layer. The removal of material can be compensated for by increasing the thickness of the core layer. In many embodiments, the PWB substrate design can be modified to reduce the density of clearance holes in a core layer. The modification of PWB substrate designs to reduce the impact of clearance hole drilling on the mechanical properties of a core layer is discussed further below.

Further, the build-up substrate 200 of the present invention has a fine and high density wiring structure on the build-up portions produced by build-up method. Thus, electrical connection pads 40 for further connection can be disposed at small pitch on the outermost wiring pattern. This is advantageous for connecting or mounting of a semiconductor chip directly having a number of connection pin pads arranged at small pitch.

Preparing Clearance Hole Data from Artwork Data

Figure 7A:
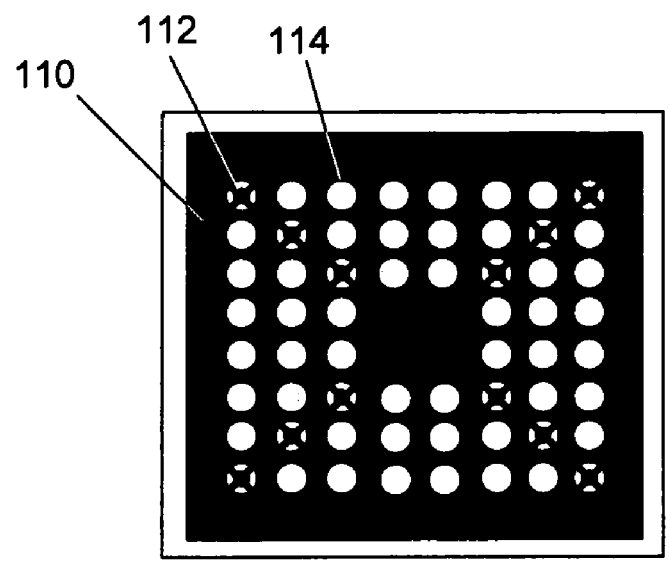
FIG. 7A is a graphical representation of artwork in Gerber data for a ground plane.

A conventional PWB substrate design typically assumes that the core layer is dielectric and is constructed using a glass fiber reinforcement. Processes can be applied to the Gerber data of a conventional PWB substrate design to enable the manufacture of a PWB substrate in accordance with embodiments of the invention. FIG. 7A is a graphical representation of artwork in Gerber data for a ground plane in a convention PWB substrate design that assumes the ground plane is a layer of copper within the PWB substrate and that the core layer is dielectric. In a conventional PWB anti-pads 114 are etched onto the ground plane layer in locations where plated through holes intersect the ground plane area 110 and an electrical connection between the plated through holes and the ground plane is not desired. The size of the anti-pads is always greater than the size of the plated through hole passing through anti-pad area. Pads 112 called thermal pads are also patterned on the ground plane area 110. The thermal pads 112 enable plated through holes to make an electrical contact with the plane area 110. The Gerber data represented in FIG. 7A can be used to produce a ground plane on a conventional PWB substrate using standard chemical print and etch techniques.

As has been discussed above, the ground plane depicted in FIG. 7A can be implemented using a core layer of a PWB substrate in accordance with embodiments of the invention. In order to implement the ground plane using the Gerber data of FIG. 7A, the Gerber data must be modified to accommodate the physical characteristics of the core layer. Instead of standard chemical print and etch techniques, the core layer of a PWB substrate in accordance with an embodiment of the invention requires clearance hole drilling.

Figure 7B:
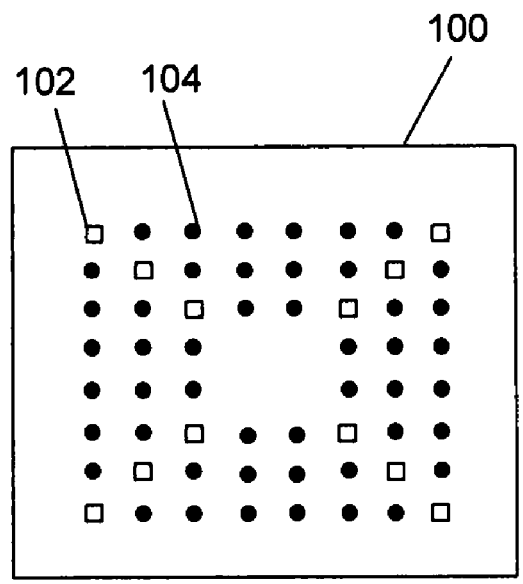
FIG. 7B is a graphical representation of the locations in which plated through holes will be drilled to implement the ground plane shown in FIG. 7A.

A graphical representation of modified Gerber data in accordance with an embodiment of the invention is shown in FIG. 7B. The modified Gerber data shows locations in which plated through holes will be drilled to implement the ground plane depicted in FIG. 7A. The clearance hole locations 104 represent locations where a plated through hole extends through the core layer and does not make an electrical connection with core layer and the clearance hole locations 102 represent locations where a plated through hole extends through the core layer and makes an electrical connection with the core layer ground plane. The line 100 represents the fabrication outline of the substrate.

Modifying PWB Substrate Designs for Improved Mechanical Properties

As discussed above, removal of material from a core layer of a PWB substrate during clearance hole drilling can negatively impact the mechanical properties of the core layer. Techniques for reducing the mechanical impact of clearance hole drilling are discussed below with respect to FIGS. 8A-8F.

Figure 8A:
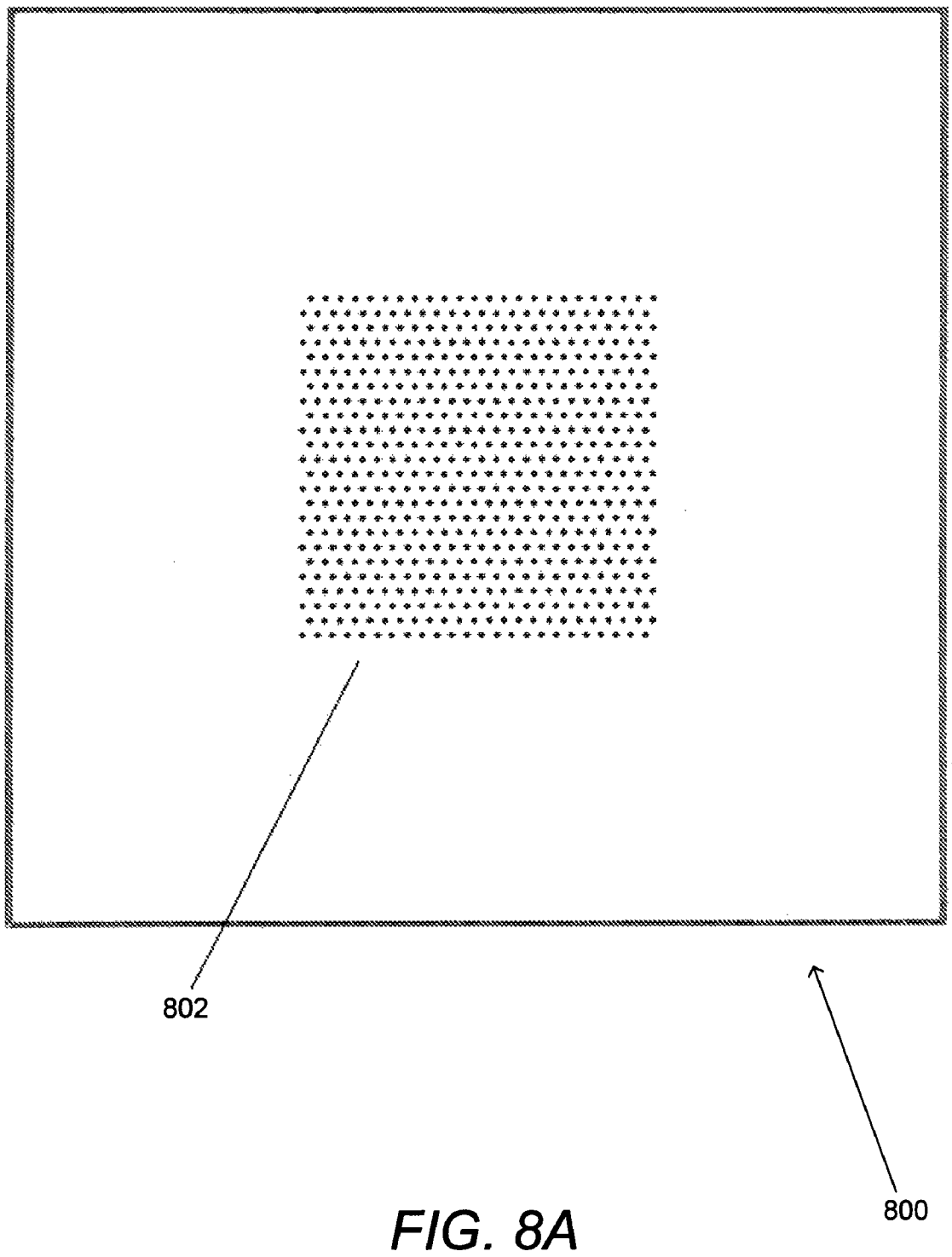
FIG. 8A is a schematic top view of a dense plated through hole pattern to be drilled through a layer of material intended for use as the core layer of a PWB substrate.
Figure 8B:
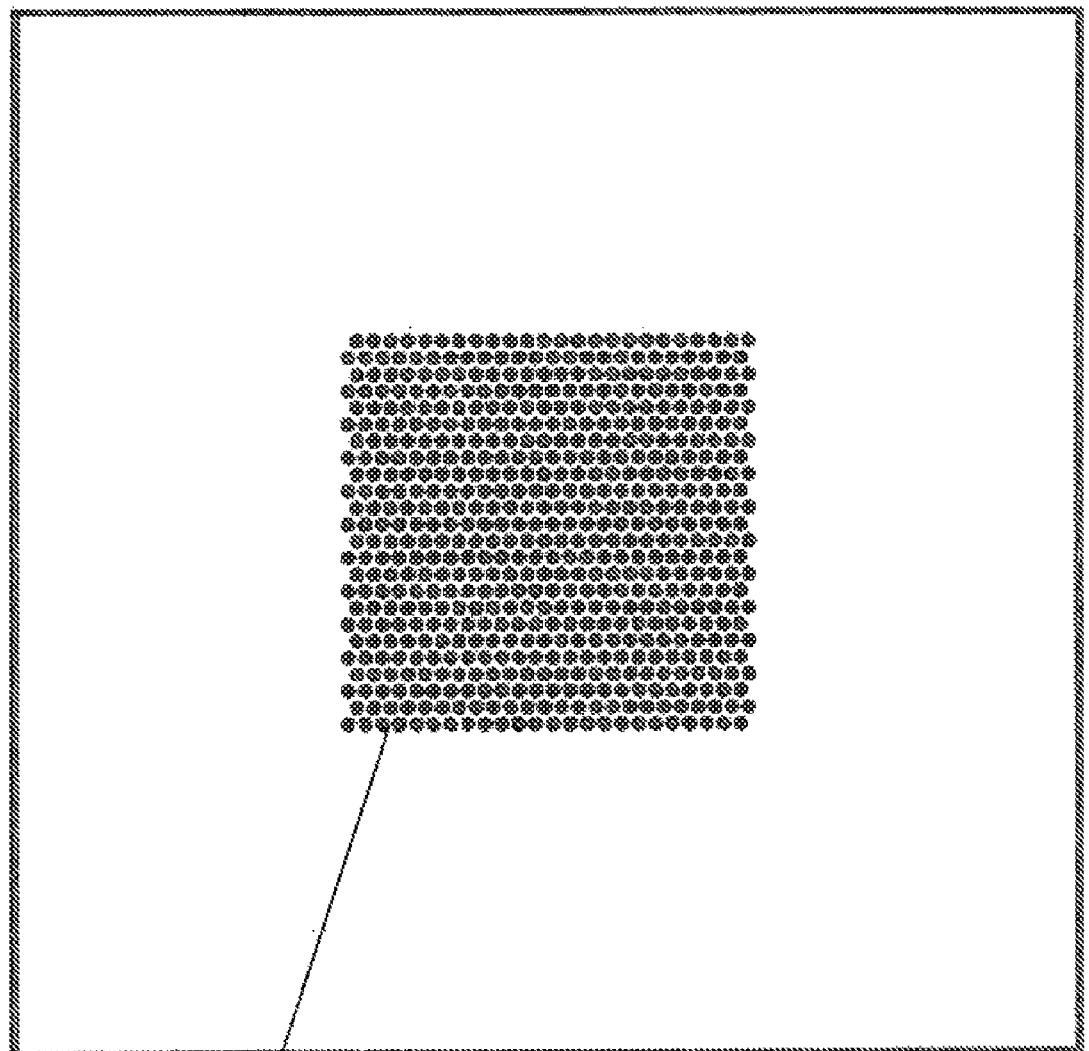
FIG. 8B is a schematic top view of a conventional clearance hole pattern drilled through a layer of electrically conductive material intended for use as the core layer of a PWB substrate and in which the plated through holes shown in FIG. 8A are to be drilled.

A graphical representation of Gerber data including a plated through hole drilling pattern for drilling a dielectric core layer is shown in FIG. 8A. The depicted Gerber data 800 shows the location of an array of plated through holes 802. Each alternating row in the array of plated through holes is connected to either a ground plane or a power plane. A graphical representation of modified Gerber data showing a clearance hole drilling pattern for drilling an electrically conductive core layer of a PWB substrate that does not act as a functional layer of the PWB substrate is shown in FIG. 8B. The depicted Gerber data 810 includes an array of clearance holes 812. The density of the clearance holes is such that very small amounts of core layer material exist between adjacent clearance holes. In many instances, the mechanical properties of the core layer would be compromised in the region of the clearance hole drilling due to the density of the clearance hole drilling.

Figure 8C:
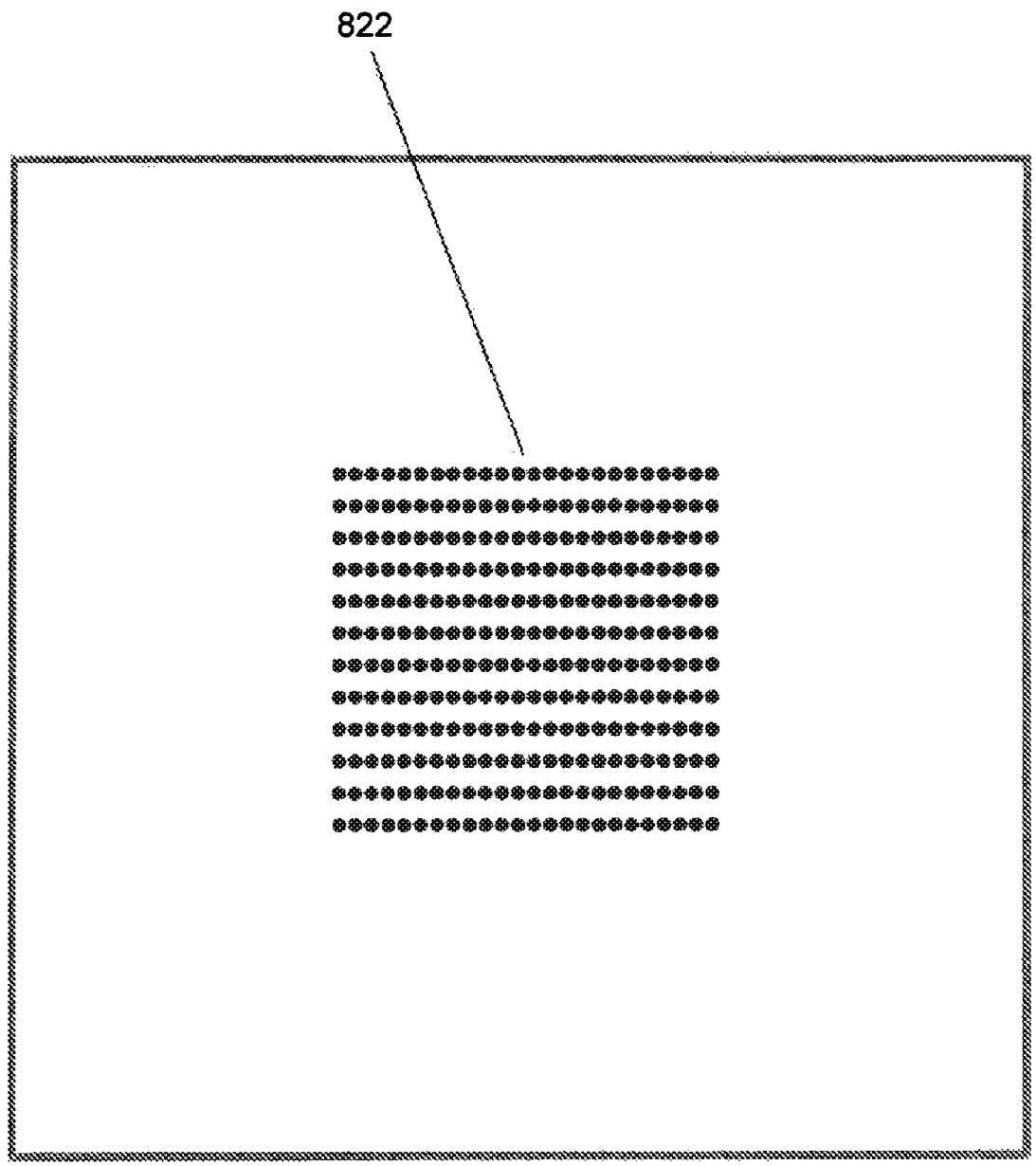
FIG. 8C is a schematic top view of a clearance hole pattern drilled through a layer of electrically conductive material intended for use as the core layer of a PWB substrate in which the core layer forms part of the circuit of the PWB substrate in accordance with an embodiment of the invention and in which the plated through hole pattern shown in FIG. 8A is to be drilled.

One approach to ensuring the integrity of the core layer when a very dense clearance hole drilling pattern is required is to increase the thickness of the core layer. Another approach is to utilize the core layer as a functional layer of the PWB substrate in accordance with an embodiment of the invention. A graphical representation of modified Gerber data showing a drilling pattern for drilling an electrically conductive core layer of a PWB substrate that acts as the ground plane of the PWB substrate is shown in FIG. 8C. The depicted Gerber data 820 includes an array of clearance holes 822. The fact that the core layer is the ground plane means that clearance holes are no longer required to electrically isolate the plated through holes that connect to the ground plane from the electrically conductive core layer. When compared with the clearance hole drilling pattern 812 depicted in FIG. 8B, the clearance hole drilling pattern 822 depicted in FIG. 8C requires the removal of approximately half as much core layer material.

Figure 8D:
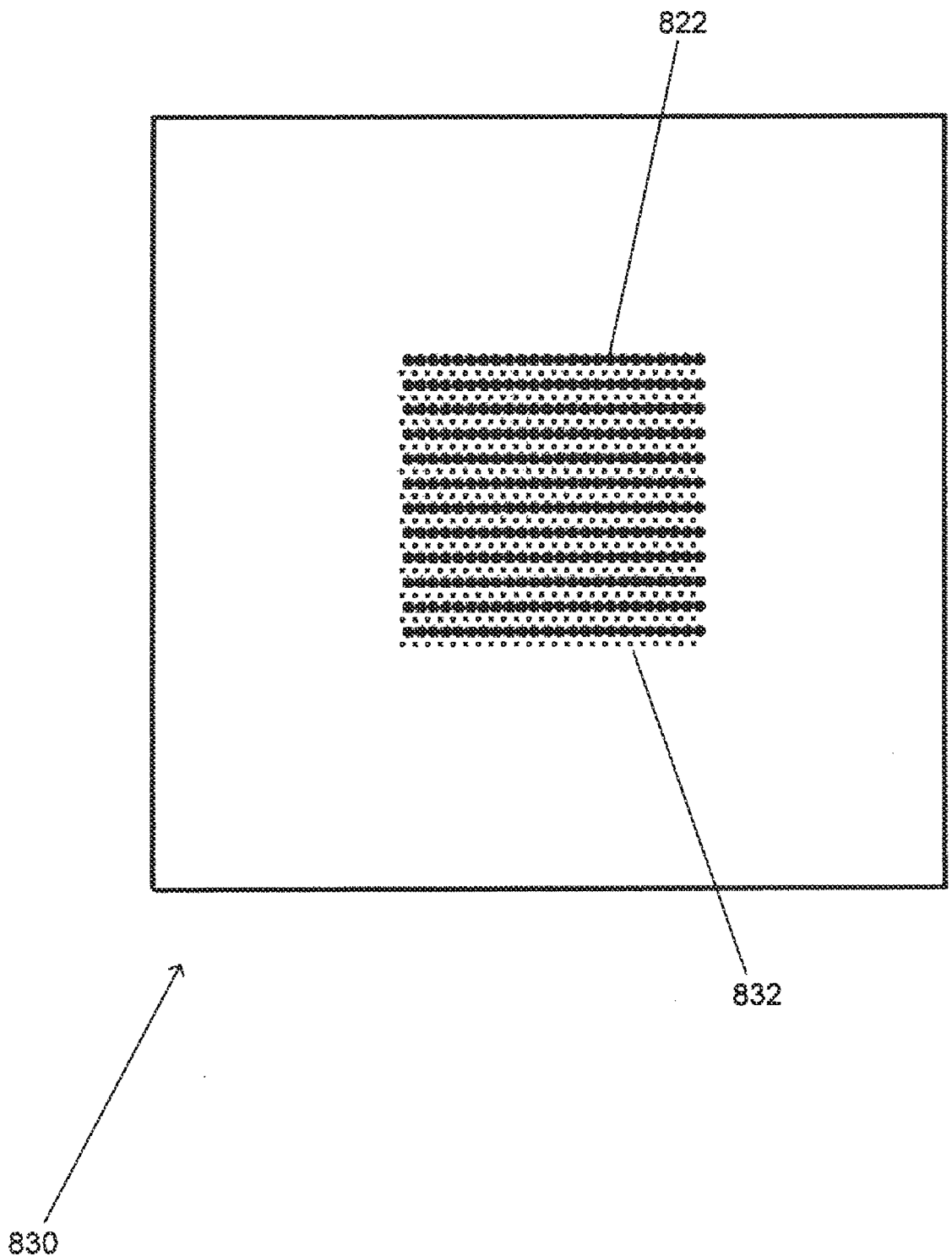
FIG. 8D is schematic top view of a clearance hole and plated through hole pattern drilled through a layer of electrically conductive material intended for use as the core layer of a PWB substrate in accordance with an embodiment of the invention.

A graphical representation of modified Gerber data showing the clearance hole drilling pattern depicted in FIG. 8C with the plated through hole drilling pattern depicted in FIG. 8A is illustrated in FIG. 8D. The depicted Gerber data 830 includes plated through hole locations that intersect the clearance holes 822 and plated through holes that intersect the material of the core layer 832.

Referring back to the Gerber data depicted in FIG. 8C, the elimination of half of the clearance holes has increased the spacing between adjacent rows of clearance holes, however, a high density of clearance holes remains within each row. The proximity of clearance holes within each of the rows can be sufficient to compromise the mechanical integrity of the core layer. As discussed above, the mechanical integrity can be buttressed by increasing the thickness of the core layer. Another option is to modify the design of the PWB substrate to increase the spacing between clearance holes in accordance with embodiments of the invention.

Figure 8E:
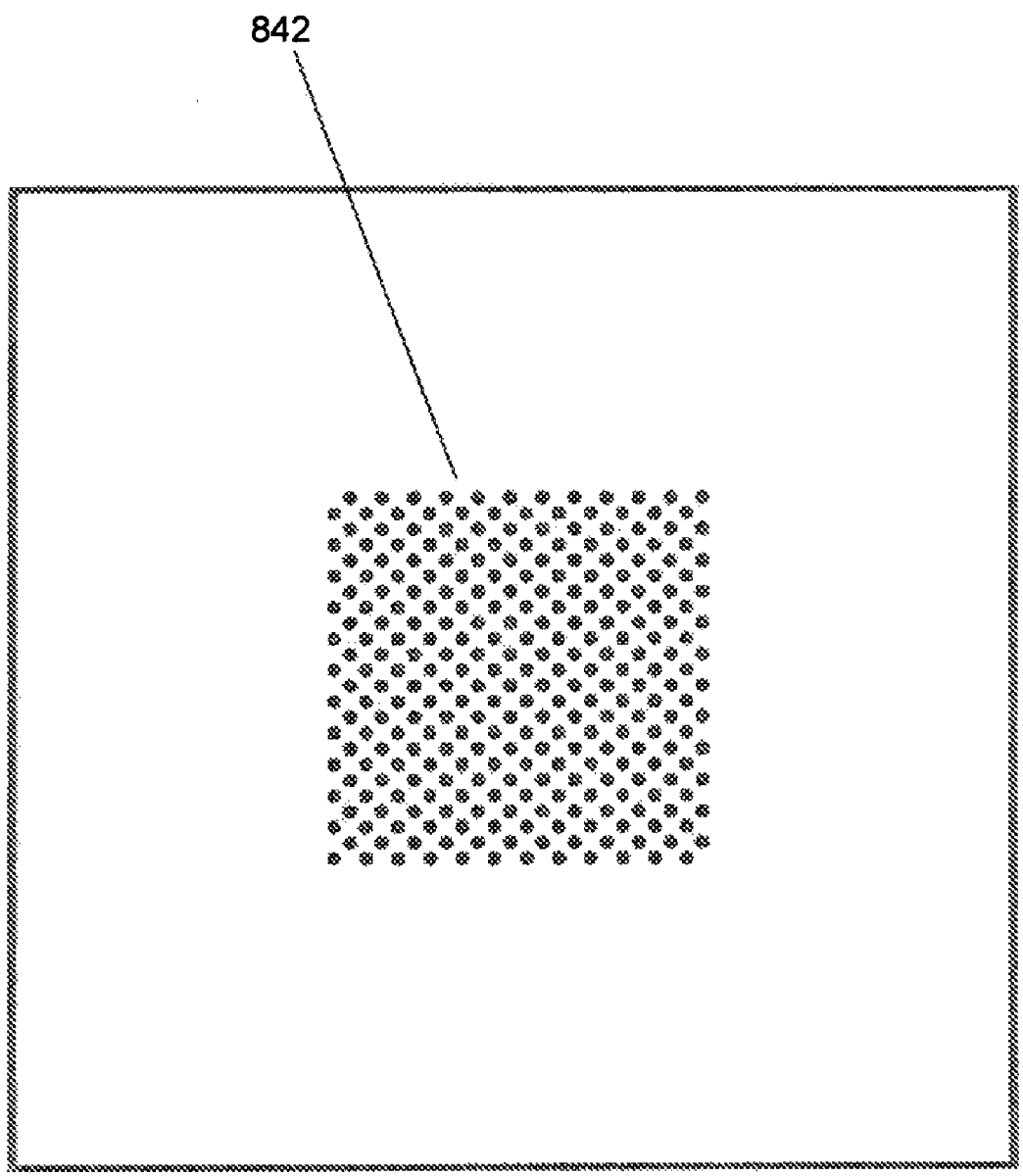
FIG. 8E is a schematic top view of a modified version of the clearance hole pattern drilled through a layer of electrically conductive material intended for use as the core layer of a PWB substrate in which the core layer forms part of the circuit of the PWB substrate in accordance with an embodiment of the invention and in which a modified version of the plated through hole pattern shown in FIG. 8A is to be drilled.

A graphical representation of Gerber data showing a clearance hole patters for a core layer of a PWB substrate that functions as the ground plane of the Substrate is shown in FIG. 8E. The depicted Gerber data 840 includes an array of clearance holes 842. In the illustrated embodiment, the array of clearance holes was formed by modifying the purpose of every second plated through hole in the array of plated through holes 802 depicted in FIG. 8A. By swapping the layer to which every second plated through hole connects, the required clearance hole pattern is modified. Instead of the rows of closely spaced clearance holes depicted in the clearance hole pattern 822 of FIG. 8C, the clearance hole pattern 842 in FIG. 8E is staggered so that the distance between adjacent clearance holes is increased.

Figure 8F:
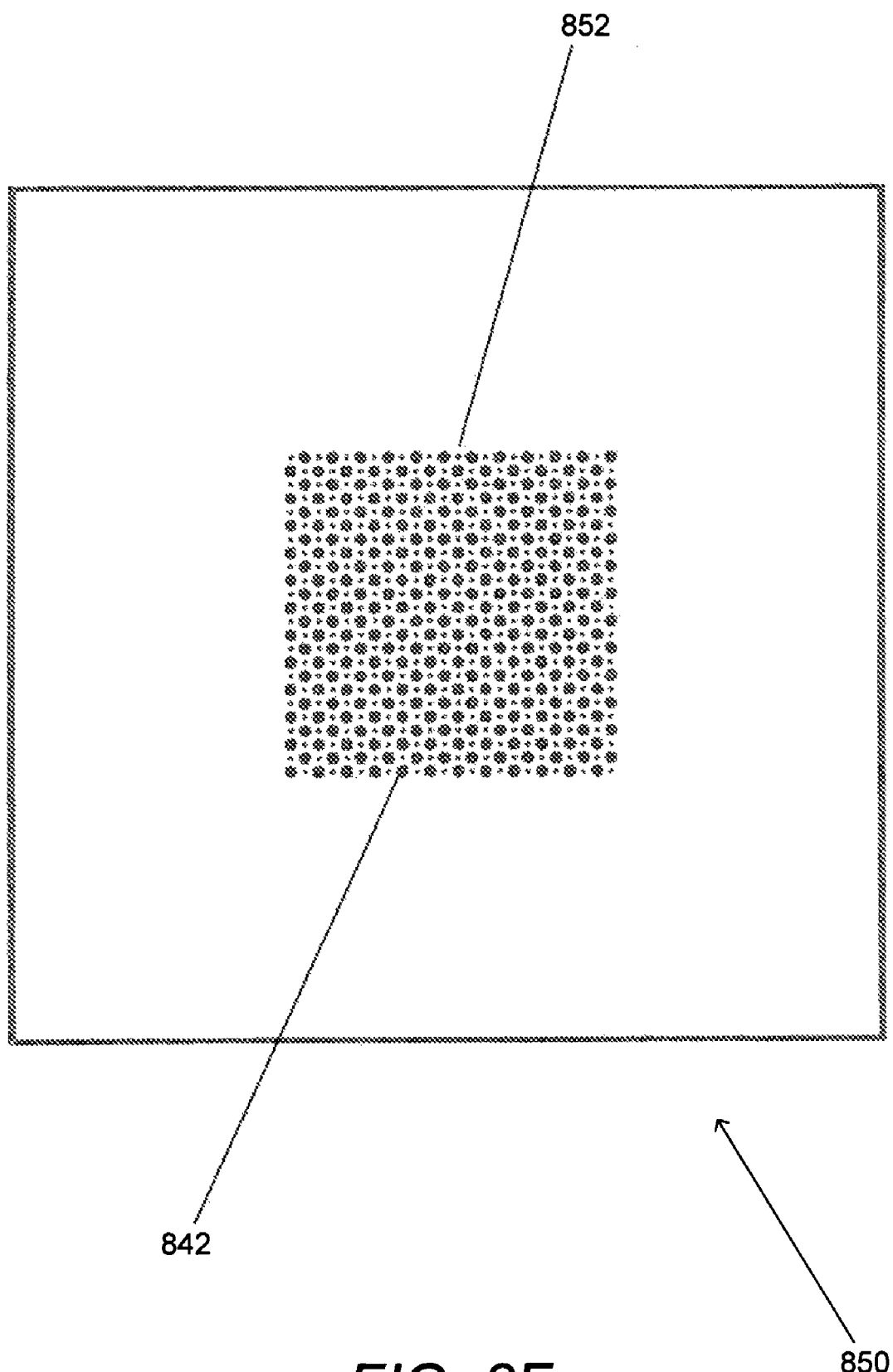
FIG. 8F is a schematic top view of a modified clearance hole and modified plated through hole pattern drilled through a layer of electrically conductive material intended for use as the core layer of a PWB substrate in accordance with an embodiment of the invention.

A graphical representation of Gerber data showing an overlay of the clearance hole pattern shown in FIG. 8E and a plated through hole drilling pattern shown in FIG. 8A is illustrated in FIG. 8F. The depicted Gerber data 850 shows that modifying the purpose of the plated through holes does not necessitate changing the locations of the plated through holes. Modifying the purpose of the plated through holes may, however, necessitate modification of the circuits on the micro wiring layers of the PWB substrate.

Although regular arrays of plated through holes are shown in FIG. 8A, similar design principles can be used to increase the spacing between clearance holes in designs that include less regularly spaced plated through holes. In a number of embodiments, utilizing the core layer as a functional layer of the PWB substrate to reduce the number of clearance holes, modifying the design of the PWB substrate to increase the separate of clearance holes and increasing the thickness of the core layer can be used in combination to ensure the mechanical integrity of the core layer. Although the examples shown in FIGS. 8D and 8F involve the use of a core layer as a ground plane, similar techniques can be applied where the core layer is used as a power plane or a split plane. Indeed a modification to the plated through hole design shown in FIG. 8A can be envisaged using a split plane where all plated through holes requiring connection to the ground plane pass through the ground plane region of the split plane and all plated through holes requiring connection with the power plane pass through the power plane region of the split plane. Use of a split plane in this way eliminates the need for clearance holes with respect to all of the plated through holes shown in FIG. 8A. In other embodiments, other modifications can be used in conjunction with core layers that are used as ground, power or split ground and power planes to reduce the density of resin filled clearance holes in high density areas of the core layers.

Completed ICs

A completed IC in accordance with an embodiment of the invention can be formed by mounting a semiconductor die on a PWB substrate having a core layer that forms part of the circuit of the PWB substrate. In many embodiments, the completion of the IC also requires encasing the semiconductor die in a protecting material.

Figure 9:
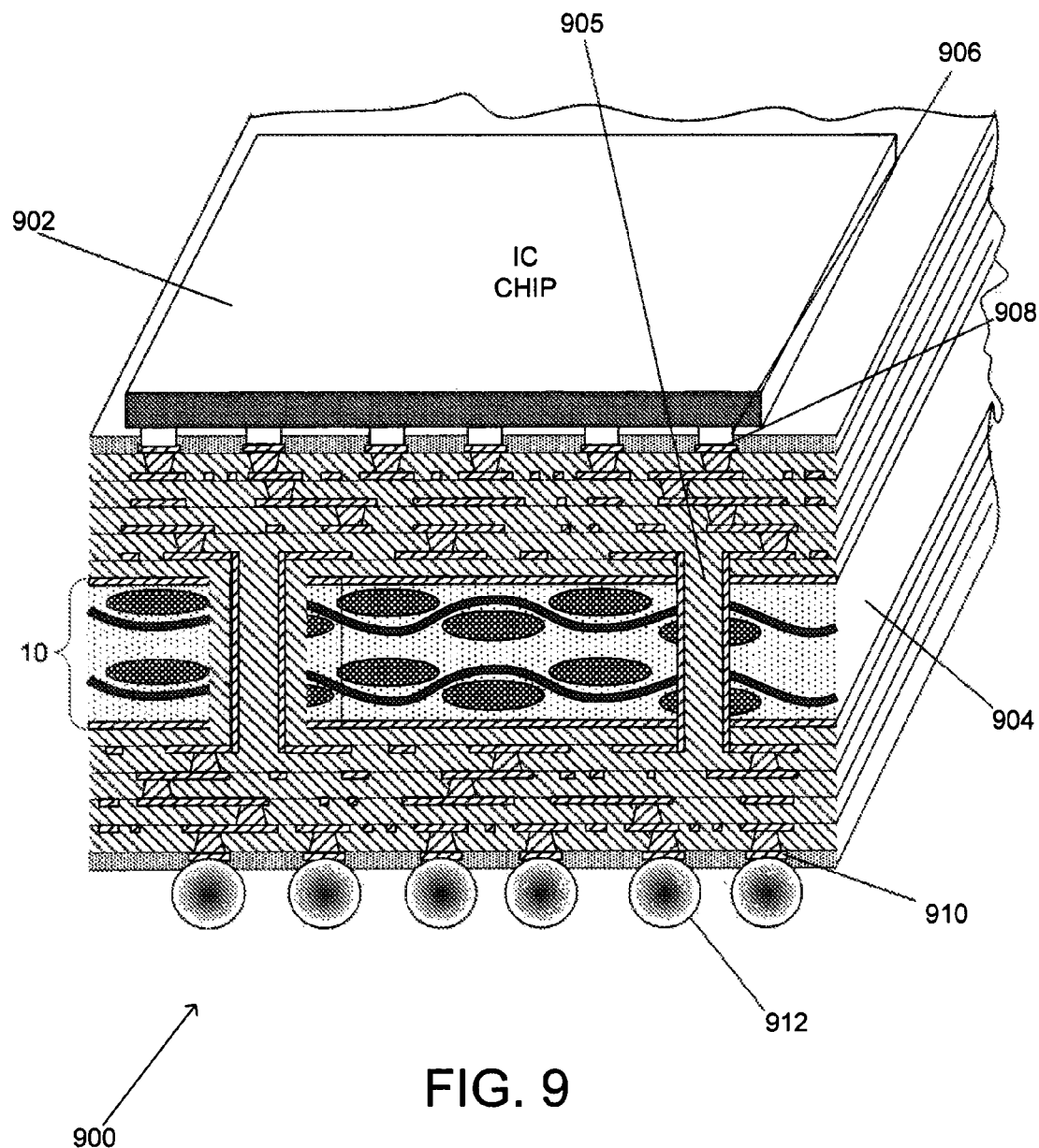
FIG. 9 is a schematic cross section of an IC including a semiconductor die mounted on a PWB substrate that includes a core layer that is part of the circuit of the PWB.

An IC in accordance with an embodiment of the invention is shown in FIG. 9. The IC 900 includes a semiconductor die 902 mounted on a PWB substrate 904. In the illustrated embodiment, the semiconductor die 902 is direct mount onto the PWB substrate 904. The PWB substrate includes a core layer 10 that forms part of the circuit of the PWB substrate. A plated through hole 905 connects the core layer 10 to circuits on micro wiring layers within the PWB substrate. Solder bumps 906 provide electrical connections pin pads of the semiconductor die and bump pads 908 on the surface of the PWB substrate 904 to which the semiconductor die is mounted. A series of solder balls 912 create electrical contacts between ball pads 910 located on the other surface of the PWB substrate 904 and second-level packaging such as conventional PWBs. In other embodiments, electrical connections can be formed using other standard techniques for connecting semiconductor dies and PWB substrates and for connecting PWB substrates and second-level packaging. In a number of embodiments, a dielectric resin material is used to protect the semiconductor die 902 and/or underfill gaps between the semiconductor die 902 and the PWB substrate 904.

Although the foregoing embodiments are disclosed as typical, it would be understood that additional variations, substitutions and modifications can be made to the system, as disclosed, without departing from the scope of the invention. Accordingly, the scope of the invention should be determined not by the embodiments illustrated, but by the appended claims and their equivalents.

What is claimed is:

1. A printed wiring board substrate, comprising:
    a core layer that includes a layer of non-metallized carbon material;
    layer of metal including an interior surface from which protrusions extend; and
    at least one build-up wiring portion formed on the layer of metal;
    wherein the layer of metal is clad by resin to one side of the non-metallized carbon material and a plurality of the protrusions contact the layer of non-metallized carbon material;
    wherein the build-up portion includes a dielectric layer comprising non-reinforced dielectric formed on the layer of metal;
    wherein the build-up portion further comprises at least one micro wiring layer including a circuit that is electrically connected to the core layer via a plated through hole;
    wherein the build-up portion further comprises an electrical interconnect to which a semiconductor die can be direct mounted.

2. The printed wiring board substrate of claim 1, wherein the coefficient of thermal expansion of the core layer is lower than the coefficient of thermal expansion of the at least one build-up portion.

3. The printed wiring board substrate of claim 1, wherein the core layer is configured to act as a ground plane.

4. The printed wiring board substrate of claim 1, wherein the core layer is configured to act as a power plane.

5. The printed wiring board substrate of claim 1, wherein the core layer is configured to act as a split power and ground plane.

6. The printed wiring board substrate of claim 1, wherein the core layer includes at least one ply of woven carbon fiber.

7. The printed wiring board substrate of claim 1, wherein the layer of metal includes an exterior surface that is planar.

8. The printed wiring board substrate of claim 1, wherein:
    the layer of non-metallized carbon material is clad on both sides with a layer of metal;
    a second build-up wiring portion is formed on the other layer of metal;
    a plated through hole connects a circuit on a micro wiring layer in the first build up wiring portion with a circuit on a micro wiring layer in the second build up wiring portion; and
    the plated through hole is electrically isolated from the core layer by a resin filled clearance hole.

9. The printed wiring board substrate of claim 1, wherein the core layer has a coefficient of thermal expansion of between 0 ppm/° C. and 12 ppm/° C. in the surface spreading direction.

10. The printed wiring board substrate of claim 9, wherein the core layer has a coefficient of thermal expansion of between 0 ppm/° C. and 9 ppm/° C. in the surface spreading direction.

11. The printed wiring board substrate of claim 1, wherein the core layer has a thermal conductivity of between 2 W/m.K and 500 W/m.K in the surface spreading direction.

12. The printed wiring board substrate of claim 1, wherein the core layer has a thermal conductivity of between 50 W/m.K and 1000 W/m.K in the surface spreading direction.

13. The printed wiring board substrate of claim 1, wherein the core layer has a tensile strength of between 5 msi and 35 msi.

14. The printed wiring board substrate of claim 1, wherein the core layer has a tensile strength of between 10 msi and 40 msi.

15. The printed wiring board substrate of claim 1, wherein the core layer has a dielectric constant that is greater than 6.0 at 1 MHz.

16. The printed wiring board of claim 1, wherein the core layer has a thickness that is at least 30% of the thickness of the printed wiring board substrate.

17. A printed wiring board substrate, comprising:
    a core layer that includes:
        a layer of non-metallized carbon material;
        a layer of metal including an interior surface from which protrusions extend;
        wherein the layer of metal is bonded by resin to the layer of non-metallized carbon material and a plurality of the protrusions contact the layer of non-metallized carbon material; and
    at least one build-up wiring portion formed on the layer of metal;
    wherein the build-up portion further comprises at least one micro wiring layer including a circuit that is electrically connected to the core layer via a plated through hole;
    wherein the build-up portion further comprises an electrical interconnect to which a semiconductor die can be direct mounted.

18. The printed wiring board substrate of claim 17, wherein the layer of metal includes an exterior surface that is planar.

* * * * *

UNITED STATES PATENT AND TRADEMARK OFFICE
CERTIFICATE OF CORRECTION

PATENT NO. : 8,203,080 B2  
APPLICATION NO. : 11/879256  
DATED : June 19, 2012  
INVENTOR(S) : Kalu K. Vasoya Page 1 of 1

It is certified that error appears in the above-identified patent and that said Letters Patent is hereby corrected as shown below:

In the Claims:

In claim 9, column 22, line 16, delete "." after 0 ppm/°C

In claim 9, column 22, line 16, delete "." after 12 ppm/°C

In claim 10, column 22, line 20, delete "." after 0 ppm/°C

In claim 10, column 22, line 20, delete "." after 9 ppm/°C

Signed and Sealed this  
Twenty-first Day of May, 2013

Teresa Stanek Rea  
*Acting Director of the United States Patent and Trademark Office*